(12) United States Patent
Sikka et al.

(10) Patent No.: US 11,574,097 B2
(45) Date of Patent: Feb. 7, 2023

(54) DEEP LEARNING BASED IDENTIFICATION OF DIFFICULT TO TEST NODES

(71) Applicant: NVIDIA Corp., Santa Clara, CA (US)

(72) Inventors: Harbinder Sikka, San Jose, CA (US); Kaushik Narayanun, Los Gatos, CA (US); Lijuan Luo, San Jose, CA (US); Karthikeyan Natarajan, Bangalore (IN); Manjunatha Gowda, San Jose, CA (US); Sandeep Gangundi, Milpitas, CA (US)

(73) Assignee: NVIDIA CORP., Santa Clara, CA (US)

( * ) Notice: Subject to any disclaimer, the term of this patent is extended or adjusted under 35 U.S.C. 154(b) by 152 days.

(21) Appl. No.: 17/231,866

(22) Filed: Apr. 15, 2021

(65) Prior Publication Data

US 2021/0295169 A1 Sep. 23, 2021

Related U.S. Application Data

(62) Division of application No. 16/537,376, filed on Aug. 9, 2019, now Pat. No. 11,010,516.

(60) Provisional application No. 62/758,298, filed on Nov. 9, 2018.

(51) Int. Cl.
*G06F 7/50* (2006.01)
*G06F 30/327* (2020.01)
*G06N 3/08* (2006.01)
*G06N 7/00* (2006.01)
*G06K 9/62* (2022.01)
*G06N 3/04* (2006.01)

(52) U.S. Cl.
CPC ......... *G06F 30/327* (2020.01); *G06K 9/6267* (2013.01); *G06N 3/0418* (2013.01); *G06N 3/084* (2013.01); *G06N 7/005* (2013.01)

(58) Field of Classification Search
USPC .............................. 716/103, 104, 106, 105
See application file for complete search history.

(56) References Cited

U.S. PATENT DOCUMENTS

| 6,278,464 B1* | 8/2001 | Kohavi | G06Q 10/10 345/440 |
|---|---|---|---|
| 6,341,364 B1* | 1/2002 | Wever | G06F 30/392 716/124 |
| 7,555,733 B1* | 6/2009 | Gee | G06F 30/367 716/106 |
| 2009/0216515 A1* | 8/2009 | Moorby | G06F 30/33 703/14 |
| 2012/0192135 A1* | 7/2012 | Gullette | G06F 30/398 716/113 |
| 2013/0290919 A1* | 10/2013 | Narayanaswamy | G06F 30/3323 716/106 |

OTHER PUBLICATIONS

NPL_GraphConvolutionalNeuralNetworks_06062018_YINGetal.
NPL_GraphEmbeddingTechniques_12222017_GOYAL.
NPL_NodeClassificationInSocialNetworks_01172011_BHAGATetal.

* cited by examiner

*Primary Examiner* — Brian Ngo
(74) *Attorney, Agent, or Firm* — Rowan TELS LLC

(57) ABSTRACT

Techniques to improve the accuracy and speed for detection and remediation of difficult to test nodes in a circuit design netlist. The techniques utilize improved netlist representations, test point insertion, and trained neural networks.

26 Claims, 24 Drawing Sheets

$CC0\ (Z) = CC1\ (A) + CC1\ (B) + 1$
$CC1\ (Z) = MIN\ (CC0\ (A), CC0\ (B)) + 1$
$CO\ (A) = CO\ (Z) + CC1\ (B) + 1$
$CO\ (B) = CO\ (Z) + CC1\ (A) + 1$

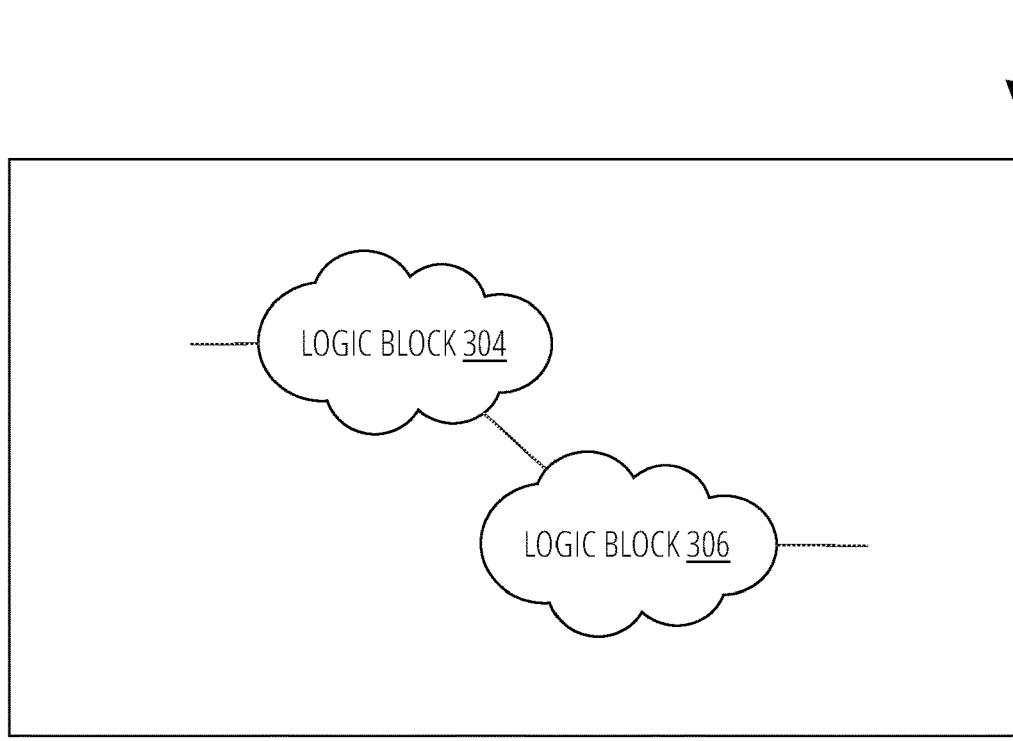
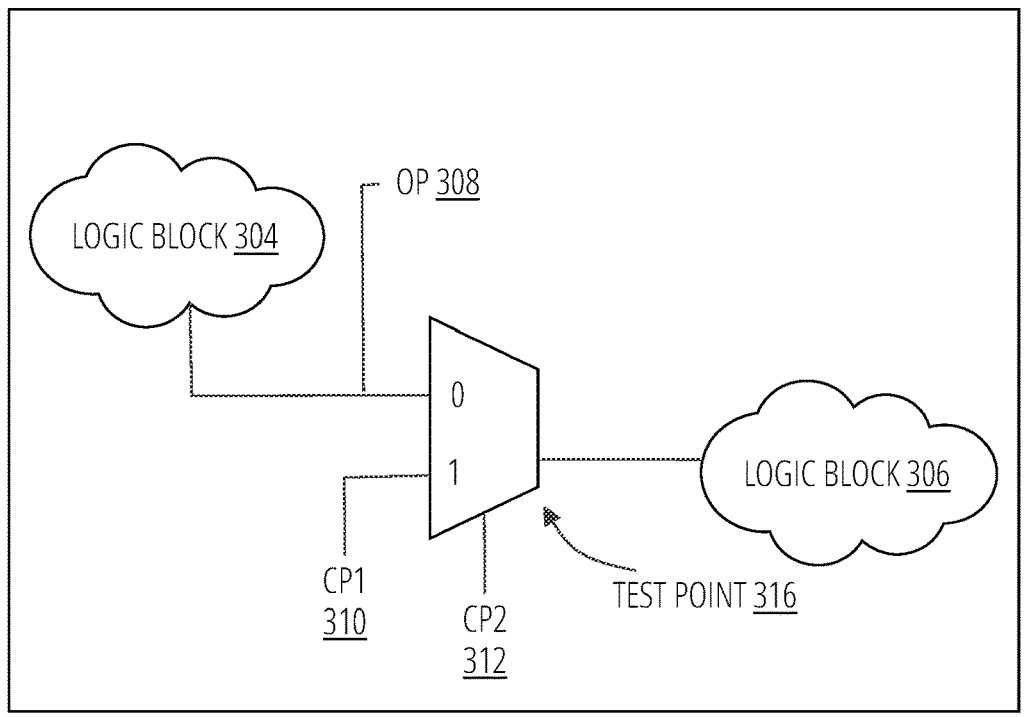
FIG. 3

Input: Graph $\mathcal{G}(\mathcal{V}, \mathcal{E})$; node attributes $\{x^{(v)} : \forall v \in \mathcal{V}\}$; Search depth $D$; non-linear activation function $\sigma(\cdot)$; Weight matrices $W_d$ of encoders $E_d, d = 1, ..., D$;

Output: Embedding of for each node $e_D^{(v)}, \forall v \in \mathcal{V}$.

1: $e_0^{(v)} \leftarrow x^{(v)}, \forall v \in \mathcal{V}$;
2: for $d = 1, ..., D$ do
3:     for all $v \in \mathcal{V}$ do
4:         Compute $g_d^{(v)}$ based on Equation (1);   ▷ Aggregation
5:         $e_d^{(v)} \leftarrow \sigma(W_d \cdot g_d^{(v)})$;   ▷ Encoding
6:     end for
7: end for

FIG. 7

DEEP LEARNING BASED IDENTIFICATION OF DIFFICULT TO TEST NODES

CROSS-REFERENCE TO RELATED APPLICATIONS

This application claims priority and benefit as a divisional application under 35 USC 121 to application Ser. No. 16/537,376, titled "DEEP LEARNING BASED IDENTIFICATION OF DIFFICULT TO TEST NODES", filed on Aug. 9, 2019, which claims priority and benefit of application Ser. No. 62/758,298, titled "DEEP LEARNING BASED IDENTIFICATION OF DIFFICULT TO TEST NODES", filed on Nov. 9, 2018, the contents of each of said applications being incorporated by reference herein in their entirety. This application claims priority and benefit of U.S. application Ser. No. 62/758,298, filed on Nov. 9, 2018, the contents of which are incorporated herein by reference in their entirety.

BACKGROUND

Computer Aided Design (CAD) and Electronic Design Automation (EDA) problems are conventionally solved with sophisticated but general-purpose software tools. Deep learning techniques offer the potential to go beyond these generic tools and train software on company-specific data to learn from company practices and internal knowledge that is not publicly available. "Deep learning" refers to an artificial intelligence function that imitates the workings of biological neural networks in processing data and creating patterns for use in decision making. Deep learning is a subset of machine learning utilizing artificial neural networks capable of learning based on experience, usually, initially, from a training data set. Deep learning is often implemented using deep neural networks. "Deep neural network" refers to an artificial neural network with one or more hidden layers. In addition, after a deep neural network (DNN) has been trained, it may provide faster results than traditional software techniques.

A challenge in applying deep learning (DL) techniques to CAD and EDA problems is mapping the problems into a DL solution space. Representation of netlists is particularly difficult because netlists are a class of directed acyclic graph (DAG) in which each node of the graph is assigned with specific logic block characteristics such as unique combinatorial logic. "Combinatorial logic" refers to logic to convert one or more input signals into output signals. Non-limiting examples of combinatorial logic include Boolean logic blocks such as AND gates, OR gates, NOR gates etc.; flops, latches, and inverters; and many other types of circuits of varying complexity. "Logic block" refers to combinatorial logic with defined inputs and outputs. "Logic block characteristics" refers to characteristics of a logic block such as power consumption, propagation delay, inputs, outputs, size, and many other possibilities depending on the nature of the logic block and its use in a circuit. The logic block characteristics may vary according to the class of the logic block: RDL (resistor-diode logic), RTL (resistor-transistor logic), DTL (diode-transistor logic), TTL (transistor-transistor logic), and CMOS, for example. Sub-variants of broad logic block classes may also have logic block characteristics particular to their sub-variant type, e.g. basic CMOS logic vs. advanced CMOS types with optimizations for improving the speed or reducing the power consumption of basic CMOS-class logic blocks. "Directed acyclic graph" refers to a finite directed graph with no directed cycles. That is, it consists of finitely many nodes and edges with each edge directed from one node to another, such that there is no way to start at any node v and follow a consistently directed sequence of edges that eventually loops back to v again. Equivalently, a directed acyclic graph is a directed graph that has a topological ordering, a sequence of the vertices such that every edge is directed from earlier to later in the sequence. "Netlist" refers to a description of the connectivity of an electronic circuit. In its simplest form, a netlist comprises of a list of the electronic components in a circuit and the circuit nodes (a junction point between two components) that each is connected to. The netlist data must be preprocessed before it can be ingested by a DNN, and the preprocessing step requires human expert considerations and design trade-offs. Some data and structure of the circuit is typically preserved for processing by the DNN; other data and structure may be lost.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 3 illustrates a test point insertion example 300 in accordance with one embodiment.

FIG. 7 illustrates an algorithm 700 in accordance with one embodiment.

DETAILED DESCRIPTION

Embodiments of a pre-processor for netlists to be analyzed by a deep neural network is disclosed. "Pre-processor" refers to logic executed to generate the inputs to subsequent stages of processing, such as classification. At a high level, the pre-processor (1) performs levelization on the netlist by identifying each node level as a distance from primary inputs to primary outputs, (2) computes controllability-to-0, controllability-to-1, and observability for each node, and (3) formulates the netlist as a collection of fan-in nodes and fan-out nodes. "Fan-out node" refers to a node receiving the output of a node in a netlist or circuit. "Fan-in node" refers to a node supplying inputs to a node in a netlist or circuit. "Controllability-to-1" refers to whether the logic value at a node in a circuit can be set to logical '1'. "Controllability-to-0" refers to whether the logic value at a node in a circuit can be set to logical '0'. "Primary output" refers to outputs from a last node level of a netlist or circuit. Primary outputs are not applied to another node in the netlist or circuit. "Primary input" refers to inputs to the first node level of a netlist or circuit. Primary inputs are not generated from nodes inside the circuit or netlist, but rather are applied from outside the circuit or netlist. "Node level" refers to the level of a node within a levelized netlist. The node level is determined by how many other nodes are connected between the node's input and the primary input.

The pre-processor and other techniques disclosed herein may be applied to generate a modified graph/netlist for a circuit that can then be applied to manufacture the circuit with improved testability, and hence improved reliability.

Controllability is the ability to propagate '0' (controllability-to-0) and '1' (controllability-to-1) to the test node from either primary inputs or scan input ports. This is useful to test the node's behavior to a'1' or '0' input. Observability is the ability to measure the state of a logic value at the test node by shifting it to the scan out ports, which is again useful for testing the node's behavior to inputs.

Figure 2:
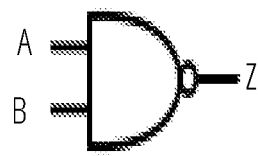
FIG. 2 illustrates a SCOAP algorithm 200 in accordance with one embodiment.

Netlist connectivity is encoded using the levelization of the circuit design. Combinatorial logic gate characteristics are applied to a SCOAP algorithm (the SCOAP) for individual combinatorial logic elements of the netlist. "SCOAP" refers to the Sandia Controllability Observability Analysis algorithm for computing testability metrics at a gate or other logic block, and which typically has linear complexity. The SCOAP algorithm (see FIG. 2) inherently includes the logic block characteristics when computing the controllability-to-0, controllability-to-1, and observability of combinatorial logic elements.

The netlist is levelized from primary inputs to primary outputs with the primary inputs set to 0. Then each output node is assigned a level using breadth-first-search (BFS) followed by depth-first-search (DFS). "Depth-first-search" refers to an algorithm for traversing or searching tree or graph data structures. The algorithm starts at the root node (selecting some arbitrary node as the root node in the case of a graph) and explores as far as possible along each branch before backtracking. "Breadth-first-search" refers to an algorithm for traversing or searching tree or graph data structures. It starts at the tree root (or some arbitrary node of a graph, sometimes referred to as a 'search key'), and explores all of the neighbor nodes at the present depth prior to moving on to the nodes at the next depth level. "Output node" refers to a node in a circuit or netlist providing the primary outputs of the circuit or netlist. See the levelized netlist 100 embodiment of FIG. 1.

Inputs to the deep neural network are (1) a collection of fan-in nodes and fan-out nodes with one or more of controllability-to-0, controllability-to-1, or observability, or (2) a randomly selected non-controllable/non-observable node (a so-called difficult to test node or DTN). "Difficult to test node" refers to a node in a circuit for which either observability or controllability are difficult or impossible. Such a node is resistant to testing by conventional means.

The following description may use certain acronyms and abbreviations as follows:
 "DPC" refers to a "data processing cluster";
 "GPC" refers to a "general processing cluster";
 "I/O" refers to an "input/output";
 "L1 cache" refers to "level one cache";
 "L2 cache" refers to "level two cache";
 "LSU" refers to a "load/store unit";
 "MMU" refers to a "memory management unit";
 "MPC" refers to an "M-pipe controller";
 "PPU" refers to a "parallel processing unit";
 "PROP" refers to a "pre-raster operations unit";
 "ROP" refers to a "raster operation";
 "SFU" refers to a "special function unit";
 "SM" refers to a "streaming multiprocessor";
 "Viewport SCC" refers to "viewport scale, cull, and clip";
 "WDX" refers to a "work distribution crossbar"; and
 "XBar" refers to a "crossbar".

Embodiments of a pre-processor will now be described for applying a graph convolutional network (GCN) to process a graph representing a netlist. "Graph convolutional network" refers to type of neural network designed to work directly on graphs and leverage their structural information. Formally, a graph convolutional network (GCN) is a neural network that given a graph G=(V, E), takes as input
 an input feature matrix N×$F^o$ where N is the number of nodes and $F^o$ is the number of input features for each node, and
 an N×N matrix representation of the graph structure such as the adjacency matrix A of G.

At each layer, node features are aggregated to form the next layer's features using a propagation rule. In this way, features become increasingly more abstract at each consecutive layer. "Node" refers to a representation of combinatorial logic in a graph, or a location in a circuit, for example between logic blocks in the circuit. Whether or not the term refers to a graph element or a point in a circuit will be evident from the context in which the term appears.

Figure 1:
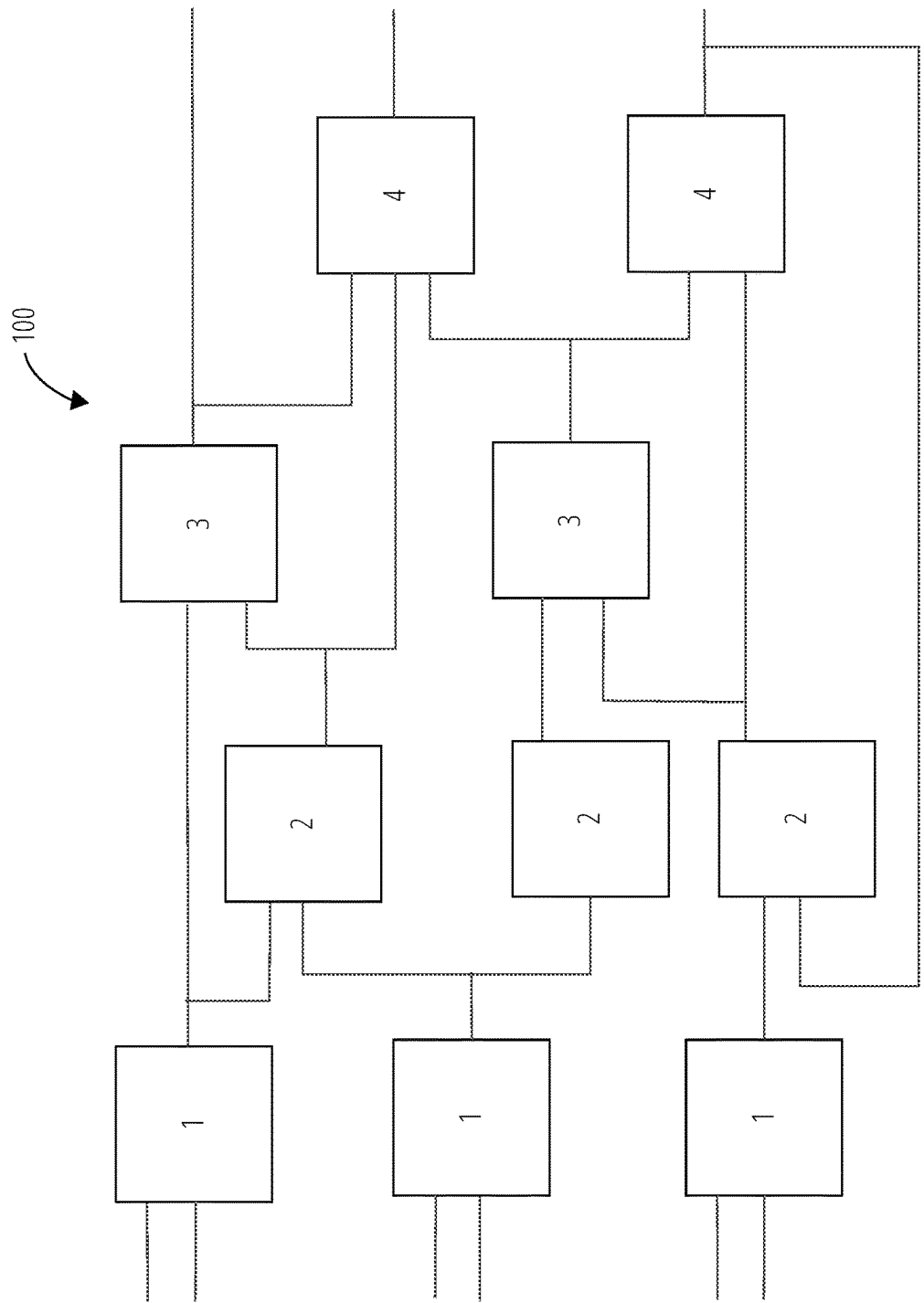
FIG. 1 illustrates a levelized netlist 100 in accordance with one embodiment.

The netlist is a levelized netlist 100 as depicted in FIG. 1, modeled as a directed graph where each logic block is represented as a node and the edges of the graph represent signal paths between logic blocks. Nodes representing sequential logic blocks, and logic blocks with multiple outputs, are split so that each node may be assigned a single corresponding label. Each node is assigned attributes of the logic block it represents, including node level, controllability-to-0, controllability-to-1, and observability. Certain of these attributes may be calculated from logic block characteristics using the SCOAP algorithm (see the SCOAP algorithm 200 example in FIG. 2). For training purposes, the node may also be assigned a label that indicates that the node is "hard" to test, i.e. if it is a difficult to test node. This determination may be made, for example, using commercial techniques such as TetraMax or by simulation with random vectors. The directed acyclic graph is then used to train one more graph convolutional network. After training, the graph convolutional network makes predictions about whether nodes in an input netlist are difficult to test nodes or not and assigns labels of DTN or non-DTN to each node.

The predictions about whether nodes are difficult to test nodes or not is applied to determine whether or not to insert a test point at the nodes in the analyzed circuit. Test points improve the observability and controllability at the node, and hence they improve test coverage, but also take up space in the circuit and consume power. Test point insertion (TPI) is a broadly used approach in design for testability (DFT) to modify circuits to improve their testability.

FIG. 3 depicts a test point insertion example 300 depicting the insertion of a test point 316 between an unobservable logic block (logic block 304) and an uncontrollable logic block (logic block 306). Herein, the term "test point" is used interchangeably with "observation point". A test point 316 is inserted between the logic block 304 and the logic block 306 in the original circuit 314, producing a modified circuit 302. The test point 316 includes an observation point 308 for observing the value output from logic block 304, a control point 310 for controlling the input of logic block 306 to 0, and a control point 312 to control the input to logic block 306 to 1. The logic block 304 in the modified circuit 302 is now observable and the logic block 306 in the modified circuit 302 is now has controllability-to-0 and controllability-to-1. A netlist corresponding to the modified circuit 302 is depicted in FIG. 4.

Figure 4:
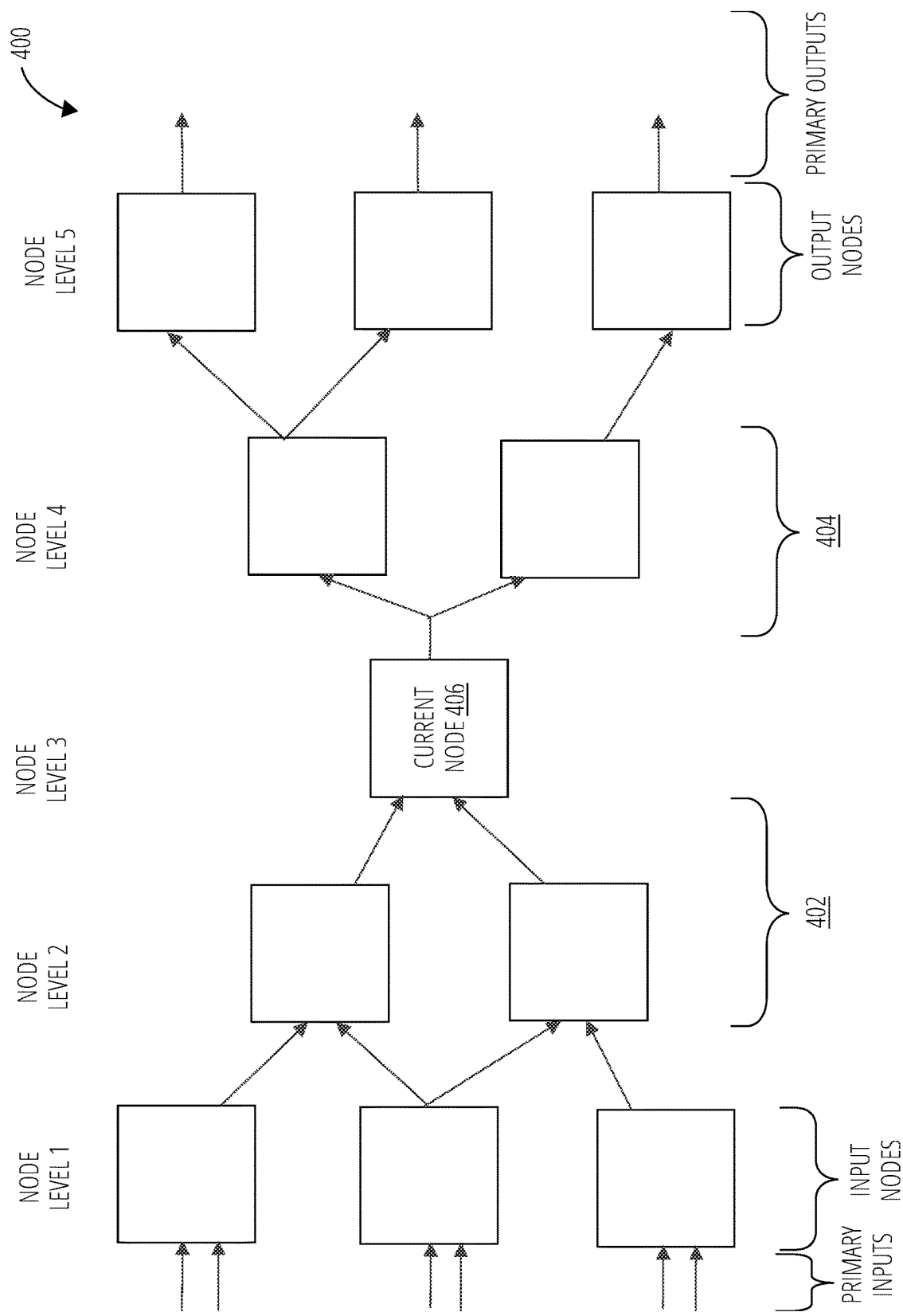
FIG. 4 illustrates a netlist-derived graph 400 in accordance with one embodiment.

FIG. 4 illustrates a netlist-derived graph 400 in one embodiment. In this example the netlist-derived graph 400 is a directed acyclic graph. The node embeddings that form the input to the deep neural network classifier are derived from the fan-in cone 402 and fan-out cone 404 of a current node 406 being analyzed in the netlist-derived graph 400. "Node embedding" refers to mapping a node from a graph to a vector space, while preserving relevant graph properties of the node such as connectivity.

Vector spaces are more amenable to analysis by deep neural networks than are graphs. Vector operations are often simpler and faster to process than the equivalent graph operations, especially in deep learning applications. Node embedding is the process of representing graphs and other network structures in vector space, while preserving their properties, including connectivity. The embeddings are input as features to a model, and parameters of the graph or nodes are learned based on training data. This obviates the need for complex classification algorithms applied directly on the graph. More specifically, the node embeddings are derived from the local neighborhood of the current node 406. "Local neighborhood" refers to the nodes of a graph within D hops of a selected node, where D is the local neighborhood depth. the nodes of a graph within D hops of a selected node, where D is the local neighborhood depth.

The deep neural network then predicts whether nodes in the graph are difficult to test nodes or not, and test point insertion logic uses the predictions to insert test nodes.

Each node embedding is represented as a vector. The ratio of the DTNs to non-DTN nodes in the netlist-derived graph 400 is typically low, e.g., 3:97, therefore selecting randomly from the set of non-DTNs may create a 1:1 test set. In one embodiment the inputs to the deep neural network are a set of vectors for each current node 406, as follows:

the current node 406 itself;
the fan-in nodes of the current node 406; and
the fan-out nodes of the current node 406.

Each node includes at least four attributes to convey the node level and SCOAP values. In some embodiments more logic block characteristics may be included for each node to improve training and inference. The particular logic block characteristics stored with each node may be implementation specific, and depending on the EDA platform, the logic block characteristics for each node may be different.

Neural network classifiers predict whether or not an input has the characteristics matching a particular classification. The output of such classifiers may be generated by an output layer implementing a SoftMax function. "SoftMax function" refers to a function of the form $f(x_i)=\exp(x_i)/\text{sum}(\exp(x))$ where the sum is taken over a set of x. SoftMax is used at different layers (often at the output layer) of artificial neural networks to predict classifications for inputs to those layers. The SoftMax function calculates the probabilities distribution of the event $x_i$ over 'n' different events. In general sense, this function calculates the probabilities of each target class over all possible target classes. The calculated probabilities are helpful for predicting that the target class is represented in the inputs. The main advantage of using SoftMax is the output probabilities range. The range will 0 to 1, and the sum of all the probabilities will be equal to one. If the SoftMax function used for multi-classification model it returns the probabilities of each class and the target class will have the high probability. The formula computes the exponential (e-power) of the given input value and the sum of exponential values of all the values in the inputs. Then the ratio of the exponential of the input value and the sum of exponential values is the output of the SoftMax function. Multi-class neural network classifiers output more than one classification prediction for an input. In one embodiment, the deep neural network outputs a set of two or three one-hot vector predictions: "One-hot vector" refers to a vector in which exactly one value is set and the other values are not set. An example of a one-hot vector is [0, 0, 1, 0].

01 or 10 (for DTN or Not DTN classification); or
001, 010, or 100 (for CP, OBP, and Not DTB classification).

In one embodiment the deep neural network comprises one input layer, three hidden layers, and one output layer. Each layer uses a linear artificial neuron input function $F(X)=w \times X+B$ where W is the weight of the input connection and B is the bias on the input.

Each hidden layer may utilize a normal distribution with initialization of random weights and zero bias along with zero mean and 0.1 standard deviation. The deep neural network may also utilize a Rectified Linear Unit (ReLU) activation function, or a hyperbolic tangent or other sigmoid type activation. "ReLU" refers to a rectifier function, an activation function defined as the positive part of its input. It is also known as a ramp function and is analogous to half-wave rectification in electrical signal theory. ReLU is a popular activation function in deep neural networks. The output layer is similar to a hidden layer followed by a SoftMax function layer utilizing cross entropy as a loss function. "Loss function" refers to also referred to as the cost function or error function (not to be confused with the Gauss error function), is a function that maps values of one or more variables onto a real number intuitively representing some "cost" associated with those values. An Adam Optimizer backpropagation algorithm may also be used to adjust network parameters such as the weights W. "Backpropagation" refers to an algorithm used in artificial neural networks to calculate a gradient that is needed in the calculation of the weights to be used in the network. It is commonly used to train deep neural networks, a term referring to neural networks with more than one hidden layer. For backpropagation, the loss function calculates the difference between the network output and its expected output, after a case propagates through the network. "Adam Optimizer" refers to an optimization algorithm that can used instead of the classical stochastic gradient descent procedure to update network weights iterative based in training data. Stochastic gradient descent maintains a single learning rate (termed alpha) for all weight updates and the learning rate does not change during training. A learning rate is maintained for each network weight (parameter) and separately adapted as learning unfolds. Adam combines advantages of two other extensions of stochastic gradient descent: Adaptive Gradient Algorithm (AdaGrad) that maintains a per-parameter learning rate that improves performance on problems with sparse gradients (e.g. natural language and computer vision problems), and Root Mean Square Propagation (RMSProp) that also maintains per-parameter learning rates that are adapted based on the average of recent magnitudes of the gradients for the weight (e.g. how quickly it is changing). This means the algorithm does well on online and non-stationary problems (e.g. noisy). Adam realizes the benefits of both AdaGrad and RMSProp. Instead of adapting the parameter learning rates based on the average first moment (the mean) as in RMSProp, Adam also makes use of the average of the second moments of the gradients (the uncentered variance). Specifically, the algorithm calculates an exponential moving average of the gradient and the squared gradient, and the parameters beta1 and beta2 control the decay rates of these moving averages. The initial value of the moving averages and beta1 and beta2 values close to 1.0 (recommended) result in a bias of moment estimates towards zero. This bias is overcome by first calculating the biased estimates before then calculating bias-corrected estimates.

In one embodiment the fan-in and fan out of each node is limited, e.g., to 500, resulting in an input vector of at most 500×4+500×4+4=4004 inputs, and this input is reduced to the two output classification predictions (DTN or Non-DTN) by the output layer.

In one embodiment training data for the deep neural network is organized into a Pickle Dump after shuffling and converting the data into batches (e.g., 25 batches) for training. "Pickle Dump" refers to an algorithm used in Python to convert structured data objects into serialized byte streams. Different batches are used for validation and for testing. Each of the epochs is trained through all the training batches. "Epoch" refers to a number of times the neural network is exposed to an entire data set. Each time the neural network processes all the batches in a data set, such as a training, an epoch has completed. An iteration describes the number of times a batch of data passed through the neural network. That means the batch completes a forward pass and backward pass (e.g., backpropagation occurs). Thus every time a batch of data is processed through the neural network, an iteration is completed.

For example consider a dataset of 10 samples with a batch size of 2. The neural network may then be executed for 3 epochs. Therefore, in each epoch, 5 batches are processed (10/2=5). Each batch gets processed through the algorithm, therefore there are 5 iterations per epoch. Because there are 3 epochs, there are a total of 15 iterations (5*3=15) for training. The validation batch is then applied to validate the model represented by the trained deep neural network.

Figure 5:
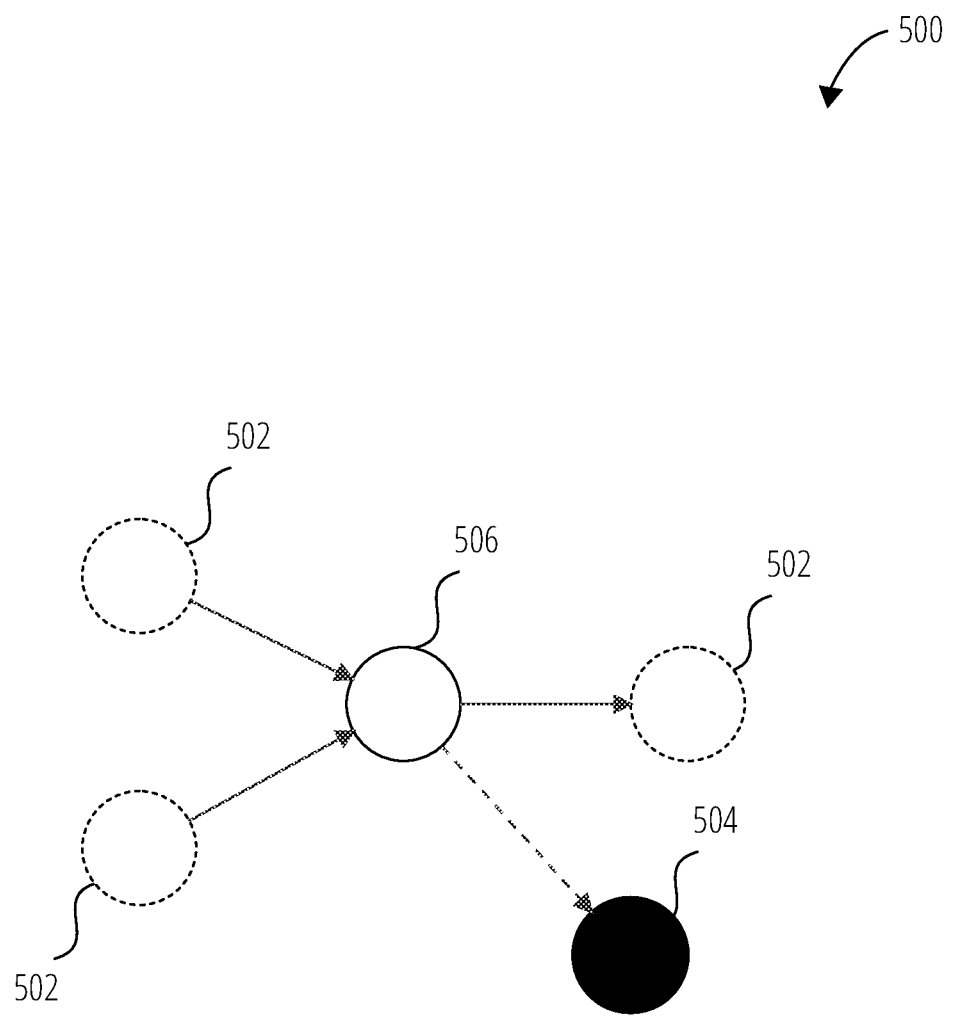
FIG. 5 illustrates a test point insertion process 500 in accordance with one embodiment.

FIG. 5 depicts a test point insertion process 500 in one embodiment. Only a portion of the overall graph is depicted. The graph is scanned and modified with test points as needed during each iteration of the pre-processor. Non-insertion points 502 are ignored while for each insertion point 506, a flop 504 is added on the fanout of the node under evaluation by the pre-processor (the "current node"). The adjacency matrix for the graph is then updated because insertion of the flop 504 changes the graph connectivity. The features of the nodes in the local neighborhood of the current node are then updated. First the observability value of the inserted insertion point 506 is set to zero, and the SCOAP values of the inserted flop 504 are set to [0,1,1,0]. The SCOAP values for the nodes in the fan-in of the node under evaluation are then updated.

Figure 6:
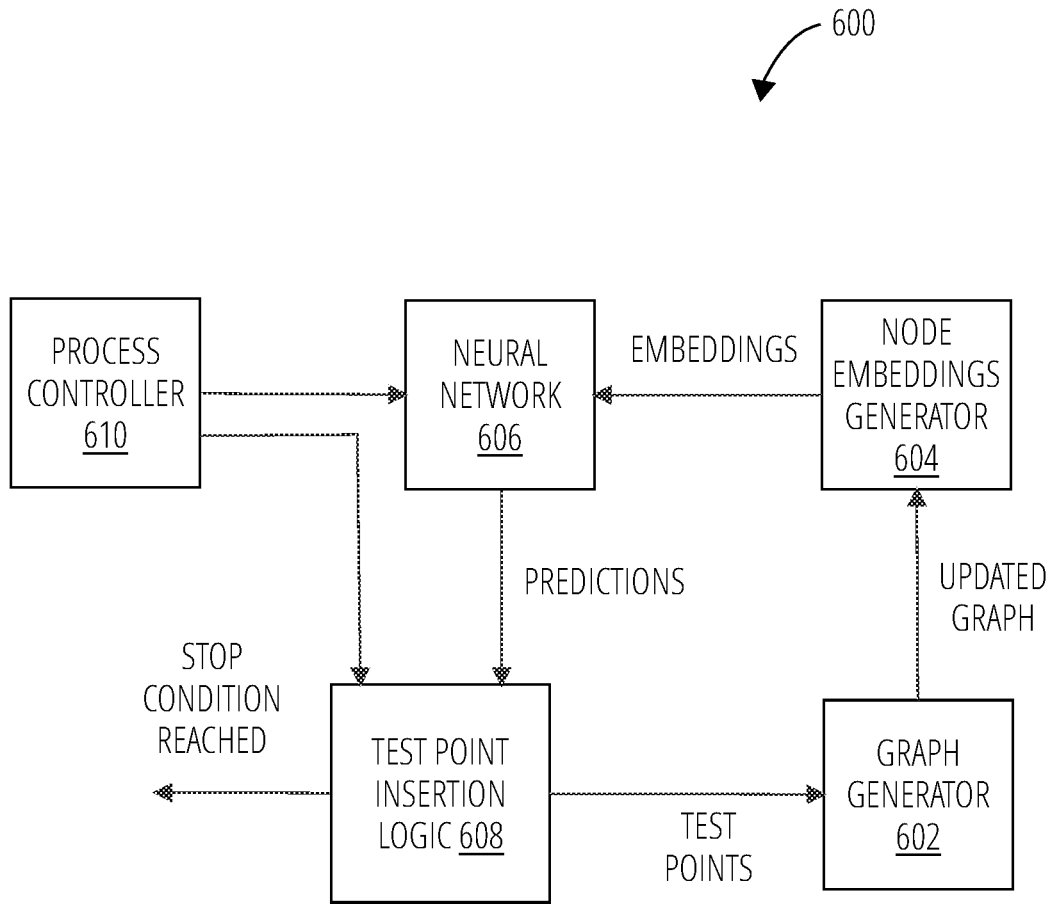
FIG. 6 illustrates a netlist test point selection and insertion process 600 in accordance with one embodiment.

Test point selection and insertion in a graph may be performed iteratively. In each iteration, the label of each node in the graph is predicted using a trained GCN model (e.g., graph convolutional network 1000), followed by selection and insertion of test points, if any. The process completes when some conditions are satisfied such as when the total number of inserted test points is achieved, or when the number of positive (DTN) predictions is less than a desired threshold. FIG. 6 illustrates an example of such a netlist test point selection and insertion process 600 and system implemented with a graph generator 602, a node embeddings generator 604, a neural network 606, a test point insertion logic 608, and a process controller 610. The process controller 610 coordinates the other components and may be implemented for example using a controller, graphics processing unit, or other components well known in the field.

The inserted test points may then be utilized to test the circuit fabricated from the netlist, for example from a package boundary of the circuit using Joint Test Action Group (JTAG) Boundary Scan Description Language (BSDL) or using other techniques known in the art.

To classify a node in the graph, the neural network generates its node embeddings based on the node's own attributes and structural information of the graph from the node's local neighborhood. These embeddings are applied to a classifier that inputs the node embeddings and predicts a label for the node. To achieve this, three kinds of layers are utilized in the graph convolutional network: aggregators, encoder layers, and classifier layers. Aggregators and encoders are used to generate node embeddings by exploiting node attributes and the neighborhood information. The classifier predicts the label for each node in the graph based on its embedding.

The node embedding is generated using aggregation and encoding layers of the deep neural network. Each of them performs a specific operation on the node. An aggregator layer gathers the feature information from the node's neighbors using an aggregation function Agg(•). This is similar to how a filter works in convolutional neural networks that operate on images, for example. An encoder layer propagates information between different layers using a weight matrix. The embedding computation process, i.e., aggregation and encoding, is performed iteratively. Fully-connected layers are used for the classifier, which inputs the node embedding and outputs a predicted label for the node.

Given a graph G(V, E) and node attributes $\{x(v): \forall v \in V\}$, the node embeddings $\{e(v): \forall v \in V\}$ may be generated per the algorithm in FIG. 7, which presumes the network is already trained to obtain the initial weights. Because the node embedding aggregates the information in local neighborhood of the current node, a depth D is specified to indicate the "radius" of the local neighborhood of the node.

Figure 8:
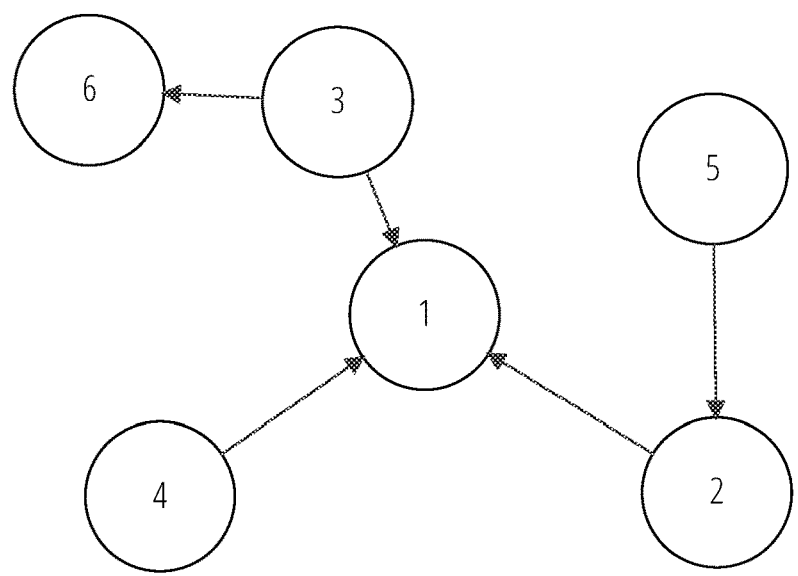
FIG. 8 illustrates a local neighborhood 800 in accordance with one embodiment.

The initial representation [LL, C0, C1, O] is set as the node attributes (line 1). There are two loops involved. In each step of the outer loop, the representation of each node in the local neighborhood is updated through aggregation and encoding. More specifically, in the d-th iteration of the outer loop, every node in the local neighborhood first aggregates information from its neighbors using aggregation function Agg(•) which takes the representations of node v and its neighbors generated at (d−1)-th iteration as input, and generates a new representation for node v, denoted by $g_d(v)$(line 4). A weighted sum function is used as the aggregation function in this example. Assuming that predecessors (PR) and successors (SU) have different weights, the aggregation function Agg(•) may be formulated as:

$$g_d^{(v)} = e_{d-1}^{(v)} + w_{pr} \times \sum_{u \in PR(v)} e_{d-1}^{(u)} + w_{su} \times \sum_{u \in SU(v)} e_{d-1}^{(u)}, \quad \text{Equation 1}$$

where $w_{pr}$ and $w_{su}$ are weights for predecessors and successors, respectively, and remain unchanged within each iteration of the outer loop. Next, a non-linear transformation is performed to encode the aggregated representation using a weight matrix $W_d \in R^{K_{d-1} \times K_d}$ and an activation function σ(•) (line 5). $K_d$ is the dimension of the embedding after the d-th iteration where $K_0$ is 4, the initial attribute dimension. A concrete example is the node embedding computation 900 depicted in FIG. 9 that depicts the process of computing a node embedding with D=2 on the local neighborhood 800 depicted in FIG. 8. Essentially, after d iterations, the embedding of a node combines the information of its d-hop neighborhood. When the maximum configured depth D is reached, the final embeddings are obtained and input to the fully-connected layers of the deep neural network for classification. Parameters to train may include $w_p$, $w_{su}$, W1, . . . , WD and parameters in fully connected layers. Parameters in the deep neural network can be trained end-to-end. An advantage over transductive approaches is that the classification procedure for each node is only based on its local neighborhood information and the learned parameters, and can be shared across different graphs.

Making the derived classification model scalable to large graphs is important especially because fast inference is desired. The algorithm 700 depicted in FIG. 7 is an iterative algorithm but inefficient because the local neighborhoods of different nodes may overlap, thus there are many duplicated computations. An alternative algorithm for inference computation scales to millions of nodes efficiently. This approach leverages the adjacency matrix of the graph, denoted by $A \in R^{N \times N}$. N is the total number of nodes in the graph. A matrix $E_d \in R^{N \times K_d}$ is calculated, in which the v-th row represents the embedding of node v after the d-th iteration, i.e., $E_d[v,:] = e_d^{(v)}$. For the local neighborhood 800 depicted in FIG. 8, the weighted sum aggregation in iteration d is equivalent to Equation 2.

$$G_d = A \cdot E_{d-1} = \begin{matrix} & \begin{matrix} 1 & 2 & 3 & 4 & 5 & 6 \end{matrix} \\ \begin{matrix} 1 \\ 2 \\ 3 \\ 4 \\ 5 \\ 6 \end{matrix} & \begin{bmatrix} 1 & w_1 & w_1 & w_1 & 0 & 0 \\ w_2 & 1 & 0 & 0 & w_1 & 0 \\ w_2 & 0 & 1 & 0 & 0 & w_2 \\ w_2 & 0 & 0 & 1 & 0 & 0 \\ 0 & w_2 & 0 & 0 & 1 & 0 \\ 0 & 0 & w_1 & 0 & 0 & 1 \end{bmatrix} \end{matrix} \times \begin{bmatrix} e_{d-1}^{(1)} \\ e_{d-1}^{(2)} \\ e_{d-1}^{(3)} \\ e_{d-1}^{(4)} \\ e_{d-1}^{(5)} \\ e_{d-1}^{(6)} \end{bmatrix} \quad \text{Equation 2}$$

Here $A \in R^{6 \times 6}$, $G_d \in R^{6 \times K_{d-1}}$, and the v-th row is the representation for node v after aggregation in the d-th iteration. The entire inner loop in the algorithm 700 (line 3-line 6) may be simply formulated as $$E_d = \sigma(G_d \cdot W_d) = \sigma((A \cdot E_{d-1}) \cdot W_d). \quad \text{Equation 3}$$

In this form, the algorithm is constructed as a series of matrix multiplications which are efficiently computed without duplicated computation. One issue with this modified approach is that the radix of adjacency matrix A is N×N, which is extremely large in many cases and cannot be stored all at once in a typical processor memory. However the fact that the matrix A is a sparse matrix may then be exploited. The matrix A can be represented in a compressed sparse coordinate format (COO), as a list of (value, row_index, column_index) tuples. A matrix compressed in this fashion can be stored in a typical processor memory all at once to enable the matrix multiplication. For instance, in the COO representation of A in Equation 3 each column is a tuple including the value and indices of a non-zero element in the matrix, as follows:

value: [1, $w_1$, $w_1$, $w_1$, $w_2$, 1, $w_1$,$w_2$,1, $w_2$,$w_2$,1, $w_2$, 1, $w_1$,1]
r_index: [1, 2, 3, 4, 1, 2, 5, 1, 3, 6, 1, 4, 2, 5, 3, 6]
c_index: [1, 1, 1, 1, 2, 2, 2, 3, 3, 3, 4, 4, 5, 5, 6, 6]

COO Matrix

An additional benefit is that the COO format is efficient for incremental matrix construction which facilitates graph modifications. For some types of circuits the COO representation can result in compression of the adjacency matrix by 80 percent or more.

Figure 9:
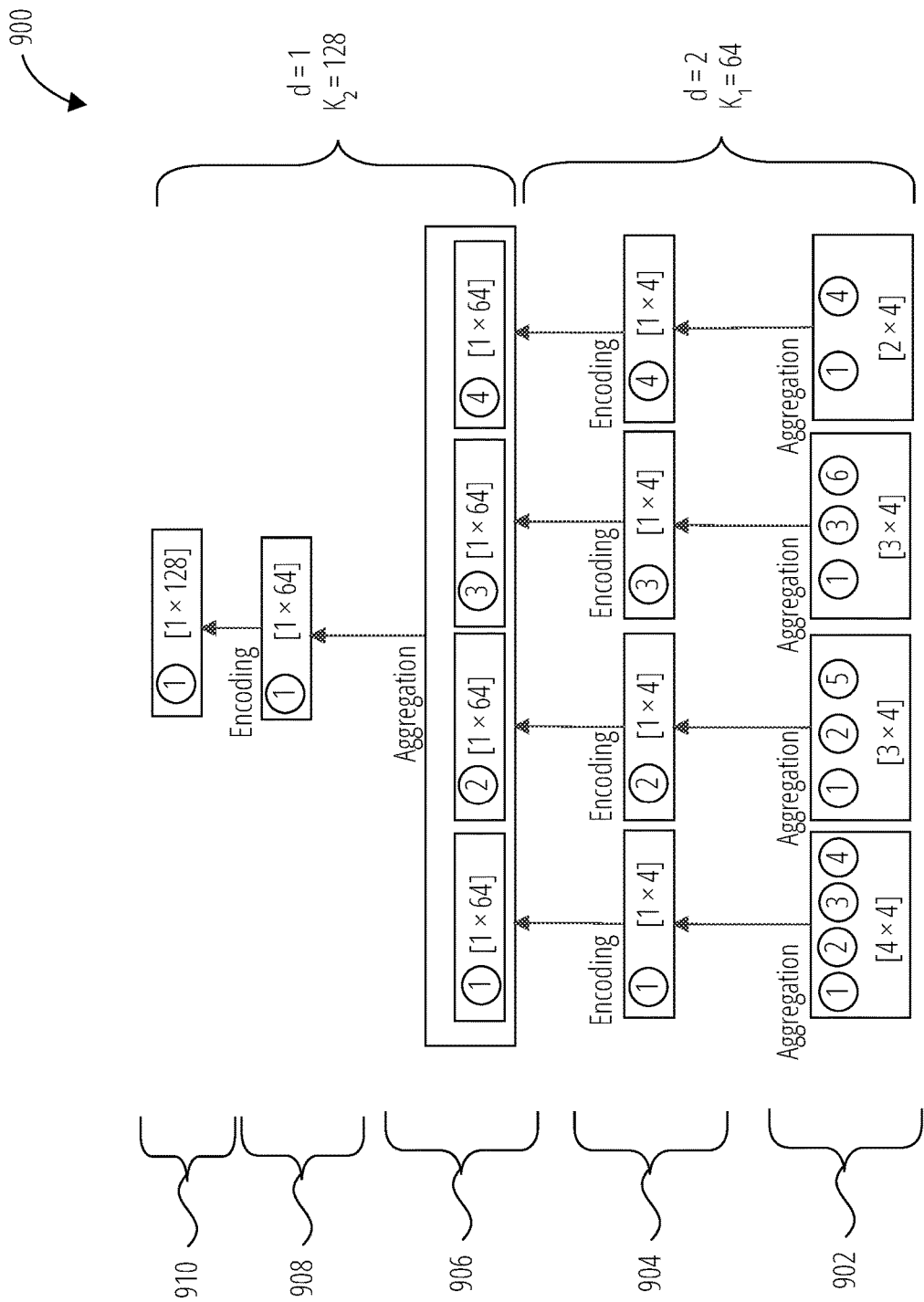
FIG. 9 illustrates a node embedding computation 900 in accordance with one embodiment.

FIG. 9 illustrates a node embedding computation 900 for computing node embeddings for local neighborhood 800. The local neighborhood 800 has a D=2 for the node (label=1). The first mean aggregation step 902 executes the computation $A \times E_{k-1}$ followed by first encoding step 904 with the weight matrix $W_k$. After the first encoding step 904 there is a ReLU activation computation. The first mean aggregation step 902 and first encoding step 904 are carried out with $K_1$=64. The second iteration involves the second mean aggregation step 906 followed by the second encoding step 908 with $K_2$=128 and generates the final embeddings 910 that are then applied to the fully-connected layers for classification.

Figure 10:
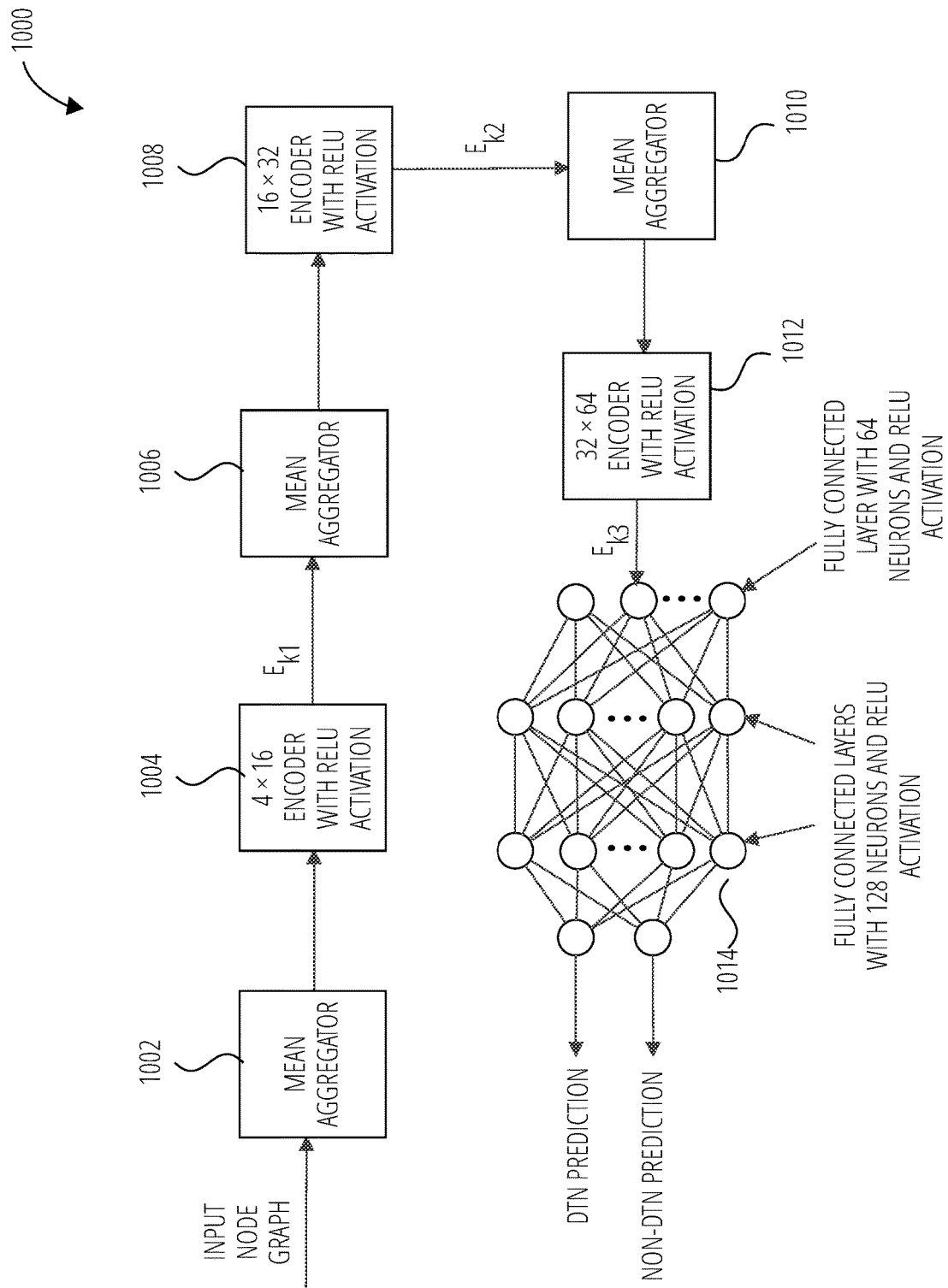
FIG. 10 illustrates a graph convolutional network 1000 in accordance with one embodiment.
Figure 11:
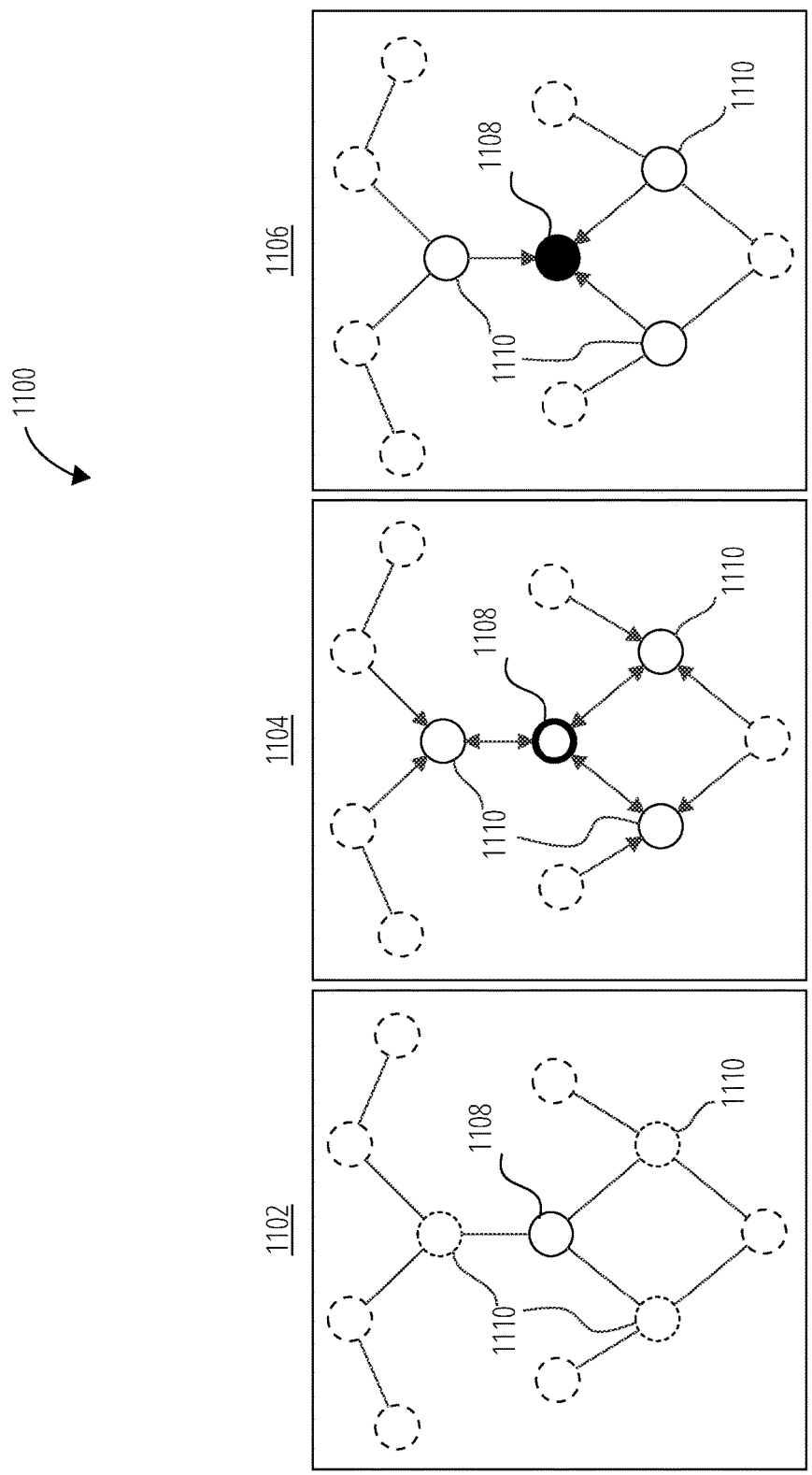
FIG. 11 illustrates a feature aggregation algorithm 1100 in accordance with one embodiment.

FIG. 10 illustrates a graph convolutional network 1000 in one embodiment. The graph convolutional network 1000 comprises a first aggregator layer 1002, a first encoder layer 1004, a second aggregator layer 1006, a second encoder layer 1008, a third aggregator layer 1010, a third encoder layer 1012, and fully connected layers 1014. To classify a node in the graph, the graph convolutional network 1000 first generates the node embedding based on the node's own attributes and the attributes of nodes in the local neighborhood. This is referred to as aggregation. The aggregators combine the features of a node with the features of the nodes in the neighborhood. The encoders project the feature vector for the node from a lower dimensional space to a higher dimensional space, if necessary. These aggregation-encoding operations are effectively a pre-processor for the input to the fully connected layers 1014. They can be performed repeatedly depending on the neighborhood region for the node, as shown in FIG. 11. Once the node embedding is determined, a classifier (e.g., the fully connected layers 1014) inputs the node embedding and predicts a label for the node (DNT or not-DTN, for example).

Each aggregator and each encoder may be implemented as a layer of the graph convolutional network 1000. Each performs a specific operation on a node. An aggregator gathers the feature information from the node's neighbors using an aggregation algorithm. An encoder propagates values between layers of the graph convolutional network 1000 using a weight matrix. The embedding computation process, i.e., aggregation and encoding, is performed iteratively. In FIG. 10, three iterations are performed to generate the embedding. The final layers of the graph convolutional network 1000 are the fully connected layers 1014 that input the node embedding and output predictions for the label for the node.

FIG. 11 illustrates a feature aggregation algorithm 1100 for a node 1108. In the feature aggregation algorithm 1100, the thickening of the line density (i.e., dotted to solid) for the local neighborhood nodes 1110 and the node 1108 and indicate the flow of aggregated features. Graph 1102 is the initial state of the nodes in which each node comprises only its own features. In graph 1104, the arrowed lines indicate the flow and aggregation of features during the first aggregation step. In the first aggregation step, the node 1108 and the local neighborhood nodes 1110 aggregate the features of the local neighborhood around the node 1108, resulting in the thickening of the line density for node 1108 and the transition from dotted to solid for the local neighborhood nodes 1110.

In graph 1106, the arrowed lines indicate additional flow and aggregation of features toward the node 1108. In the second aggregation step, the node 1108 is black indicating the continued aggregation of information from the local neighborhood nodes 1110. Compared with the first aggregation step in graph 1104, graph 1106 aggregates all the features from the 2-hop local neighborhood of the node 1108.

After each aggregation step is completed, an encoder is utilized to project the feature vector of each node from m-dimensional space to a higher n-dimensional space by multiplying by a weight matrix $W^{m \times n}$. This may be done when the original features are in a low-dimensional space, or following each aggregation step.

Figure 12:
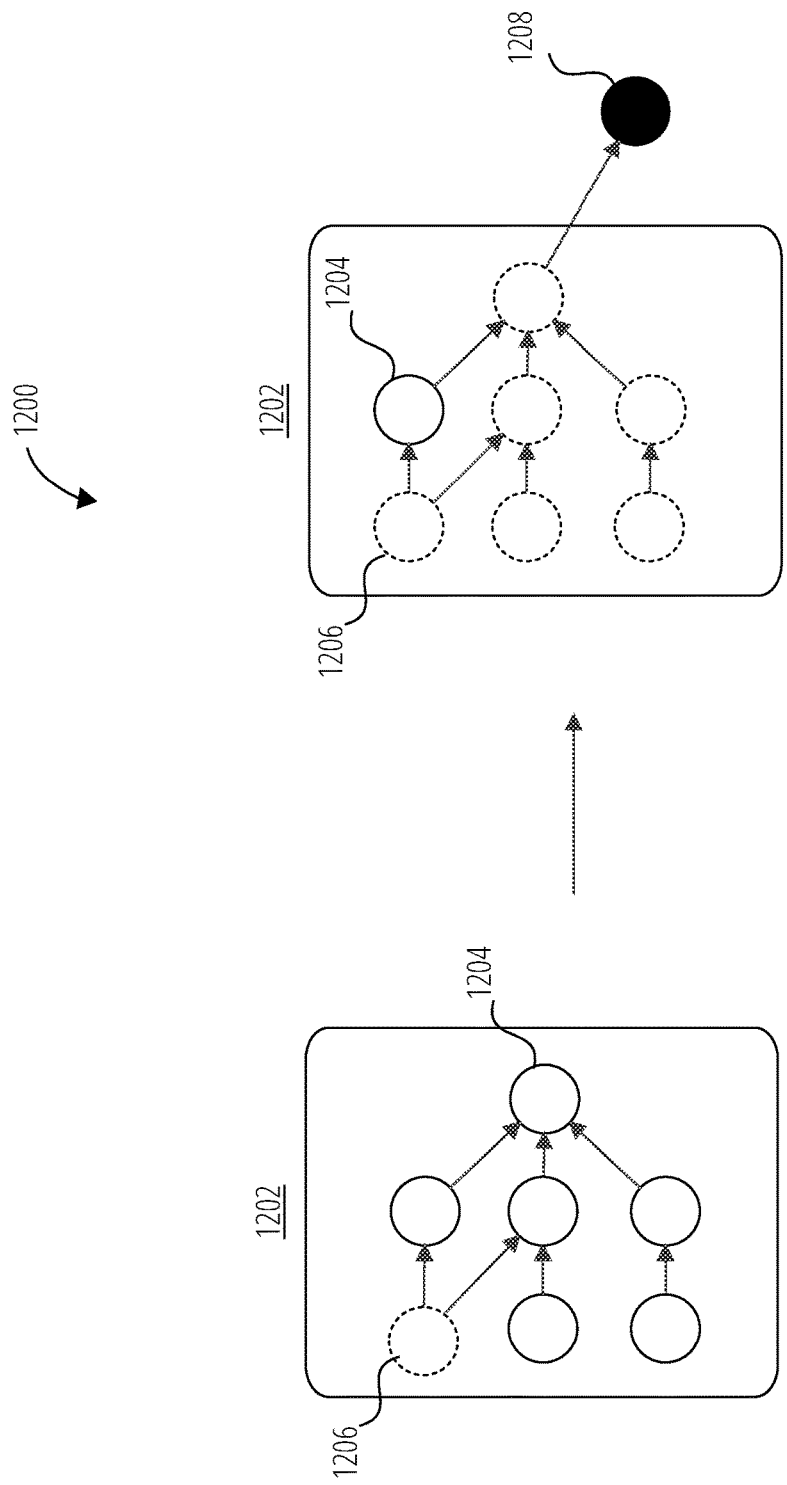
FIG. 12 illustrates a node impact calculation 1200 in accordance with one embodiment.

Referencing FIG. 12, the nodes with highest "impact" on the testability of the circuit are selected for observation point insertion. The impact of a node is determined by the reduction of the positive predictions in the node's neighborhood after inserting an observation point at the node. The impact values for all the nodes that are predicted as positive is determined and the top-ranking nodes with highest impact per iteration are selected as candidates for observation point insertion in the next iteration. The node impact calculation 1200 illustrated in FIG. 12 is an example in which six nodes in impact region 1202 are predicted as DTN-positive (predicted-1 1204) and one is predicted as DTN-negative i.e. non-DTN (predicted-0 1206). A test point 1208 is inserted on the rightmost node of impact region 1202. A second iteration indicates a single positive prediction remaining in the evaluated (impact region 1202). Therefore, the impact of the rightmost node may be calculated as 6−1=5.

Inserting observation points modifies the netlist, thus the graph should be modified, including the graph structure and node attributes. Inserting one observation point to a target node v results in (1) adding a new node p to the graph, and (2) adding an edge from the target node v to new node p. The adjacency matrix A and initial embedding matrix $E_0$ must therefore be updated. One challenge in this iterative flow is how to update the graph efficiently. The matrix A may be incrementally updated by adding a column and a row, and setting corresponding entries as $w_{pr}$ or $w_{su}$, which can be done efficiently when using the COO format by appending three tuples $(w_{pr},p,v)$, $(w_{su},v,p)$ and $(1,p,p)$. $E_0$ is updated by appending the attributes of new node p, which are set to [0,1,1,0]. Then only the attributes of the nodes in the fan-in cone of the new node p need be updated using the SCOAP algorithm. Because the graph convolutional network model is inductive, the updated A and $E_0$ may be directly applied to the classifier for prediction.

Figure 13:
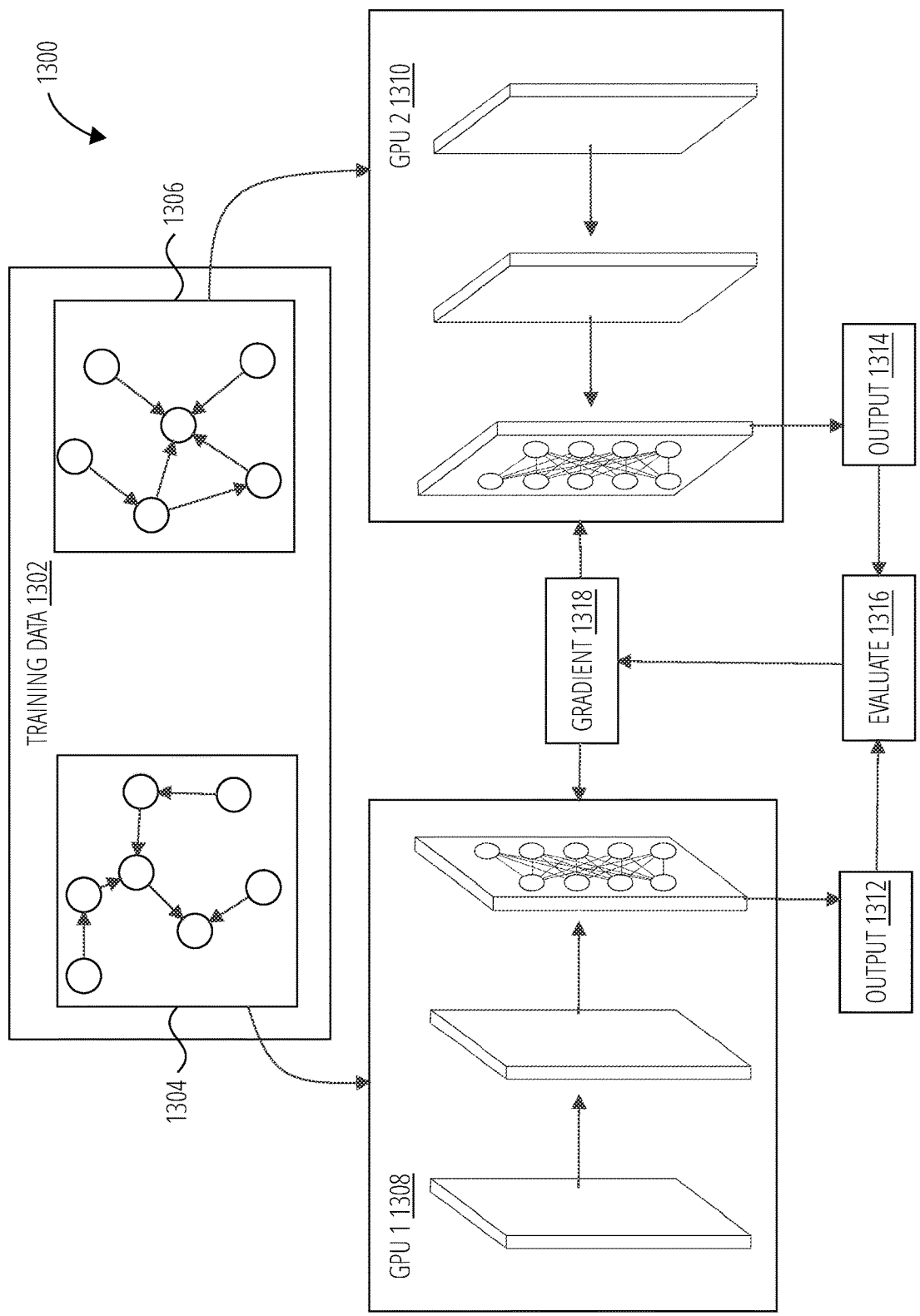
FIG. 13 illustrates a parallel training scheme 1300 in accordance with one embodiment.

FIG. 13 depicts a parallel training scheme 1300 in one embodiment. In practice, the overall graph input 1302 may comprise many sub-graphs (sub-graph 1304, sub-graph 1306). One approach to training the graph convolutional network may be to combine multiple sub-graphs into a single, large graph. However, this approach may be limited by the memory and processing capabilities of a single GPU. To overcome this potential bottleneck, a parallel training scheme 1300 using multiple GPUs may be implemented. Each sub-graph or groups of sub-graphs (sub-graph 1304 and sub-graph 1306 in the depicted example) is provided to a different GPU. For example, sub-graph 1304 may be provided to GPU 1308, and sub-graph 1306 may be provided to GPU 1310, for processing in parallel. The resulting predictions (predictions 1312 and predictions 1314) are aggregated and the loss is input to an evaluation algorithm 1316 and applied by a backpropagation learning algorithm 1318 to update the model.

Figure 14:
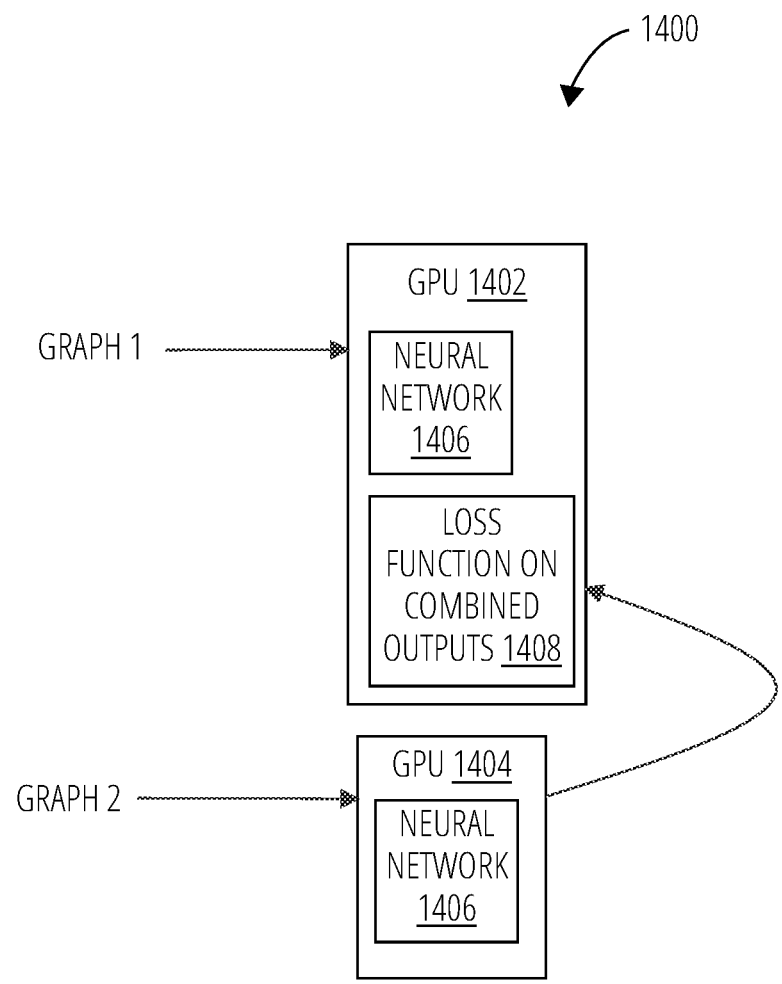
FIG. 14 illustrates parallel GPU processing 1400 in accordance with one embodiment.

A conventional data-parallelism scheme cannot directly be applied for training the deep neural network with multiple graphs because the inputs of graph and sparse adjacency matrix cannot be split into equal chunks as is done in most data-parallelism schemes. Instead of splitting the input tensors into equal chunks, the inputs are divided among multiple GPUs. The graphs may have different sizes. The feedforward computation for each graph is completed on a corresponding GPU in parallel, and the overall output is aggregated and applied to one GPU for back-propagation to train the deep neural network. An example of this is illustrated in the parallel GPU processing 1400 of FIG. 14, which illustrates a GPU 1402 and a GPU 1404 operating on a common neural network 1406 model, and in which the GPU 1402 provides the loss function on combined outputs 1408.

Figure 15:
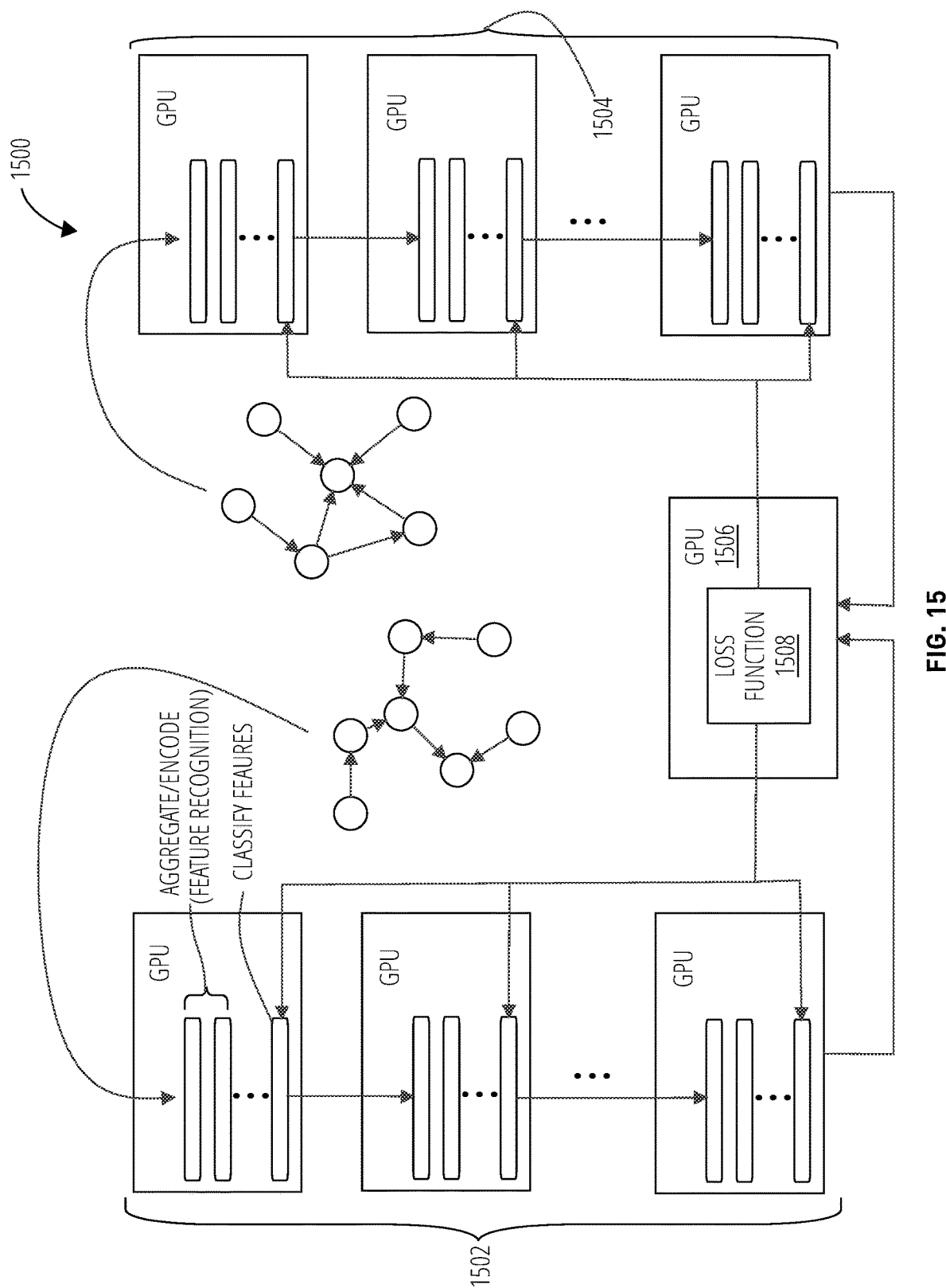
FIG. 15 illustrates a computing architecture 1500 in accordance with one embodiment.

FIG. 15 depicts a computing architecture 1500 in one embodiment comprising a multi-stage classifier 1502, a multi-stage classifier 1504, and a GPU 1506 implementing a loss function 1508. Generally, the computing architecture 1500 may include more than two multi-stage classifiers, each comprising multiple graphics processing units. Within each GPU of each multi-stage classifier, computer instructions and data provided from a memory configure the GPU to implement a graph convolutional network.

Figure 16:
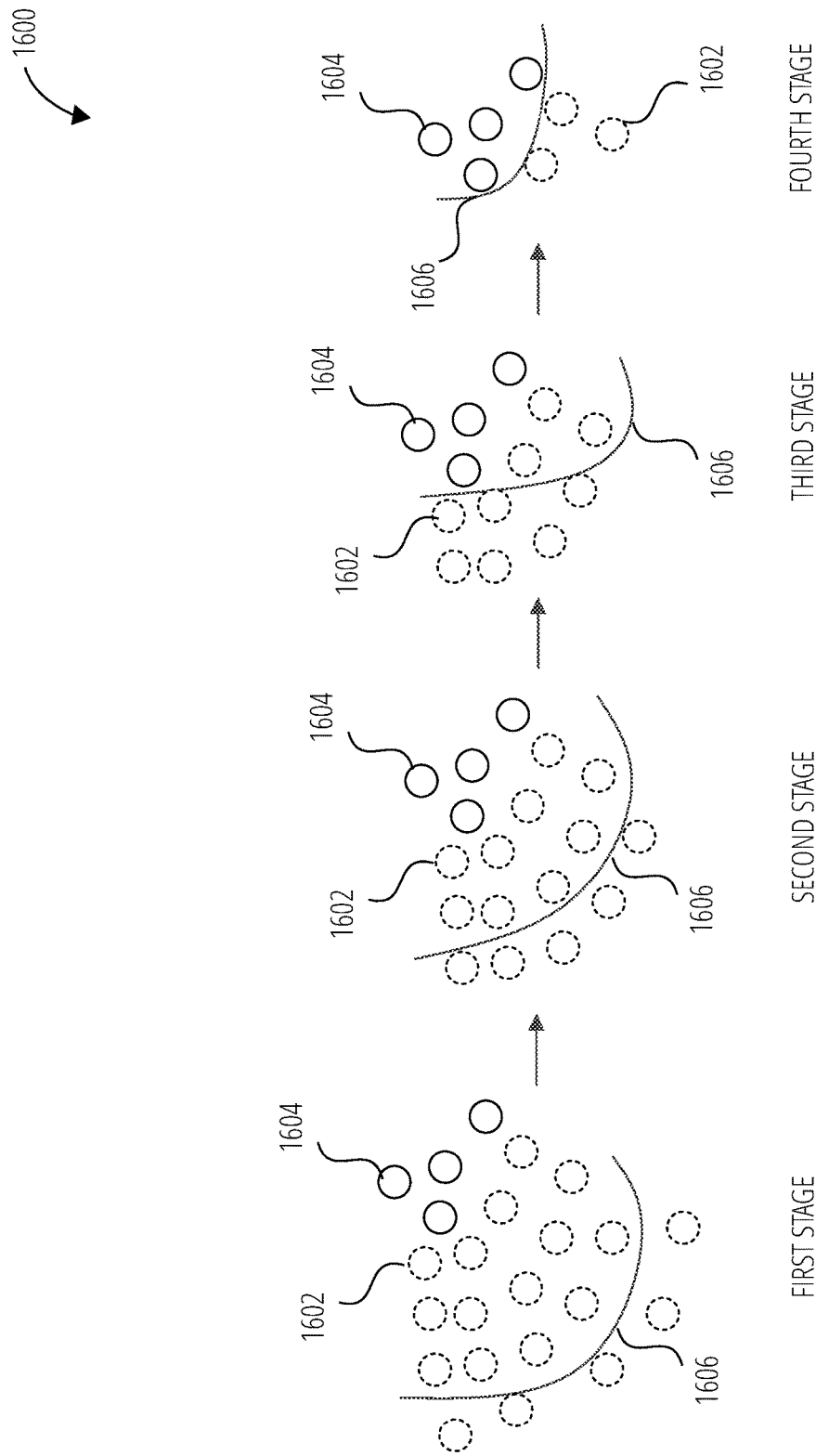
FIG. 16 illustrates a multi-stage classification 1600 in accordance with one embodiment.

In a typical graph representing a netlist, it is common to have many more non-difficult to test nodes than difficult to test nodes, which is not desirable for training machine learning models or inference. Training a single classification model can lead to poor overall performance because significant bias may be introduced towards the majority class (non-difficult to test nodes). To address this imbalance issue, a computational architecture such as depicted may be implemented. In each stage of each multi-stage classifier, one graph convolutional network is trained and filters out non-difficult to test nodes with high confidence. The remaining nodes are passed to the subsequent stage. This is achieved by imposing a large weight on the difficult to test nodes such that the training penalty (loss function 1508) of misclassifying them is large. In this way, most difficult to test nodes remain on the right side of the decision boundary of each classifier until non-difficult to test nodes are substantially reduced. After multiple stages, the remaining nodes should become relatively balanced between non-difficult to test nodes and difficult to test nodes so that the final stage makes accurate predictions. A depiction of the evolution of the decision boundary 1606 between negative classified nodes 1602 and positive classified nodes 1604 is depicted in the multi-stage classification 1600 data flow example of FIG. 16.

In addition to multi-stage classification, the computing architecture 1500 depicts the previously described techniques of combining the predictions of multiple classifiers and dedicated (one or more) GPU 1506 to computation and backpropagation of the loss function 1508. "Dedicated" means that the graphics processing unit or units are reserved and configured for the purpose of receiving predictions from classifiers implemented in other graphics processing units that do not perform backpropagation. A graphics processing unit dedicated to backpropagation may also perform classification in some embodiments. Although the multi-stage classification 1600 is depicted with a single GPU implementing each classification stage, the invention is not so limited and multiple GPUs could also be utilized in any of the stages.

In the computing architecture 1500, each multi-stage classifier may be conceptualized as a single composite graph convolutional network.

Difficult to test nodes typically only comprise a small fraction of the input graph, a condition referred to as "data imbalance". To further deal with data imbalance data pruning may be performed to reduce the number of negative (non-DTN) samples. Some embodiments may apply three pruning conditions to limit the graph to a set of likely non-DTN nodes: the flops in the netlist, the cells driving flops, and the cells with the zero observability.

The algorithms and techniques disclosed herein may be executed by computing devices utilizing one or more graphic processing unit and/or general-purpose data processor (e.g., a 'central processing unit or CPU). Exemplary machine architectures will now be described that may be used to carry out the techniques disclosed herein.

Parallel Processing Unit

Figure 17:
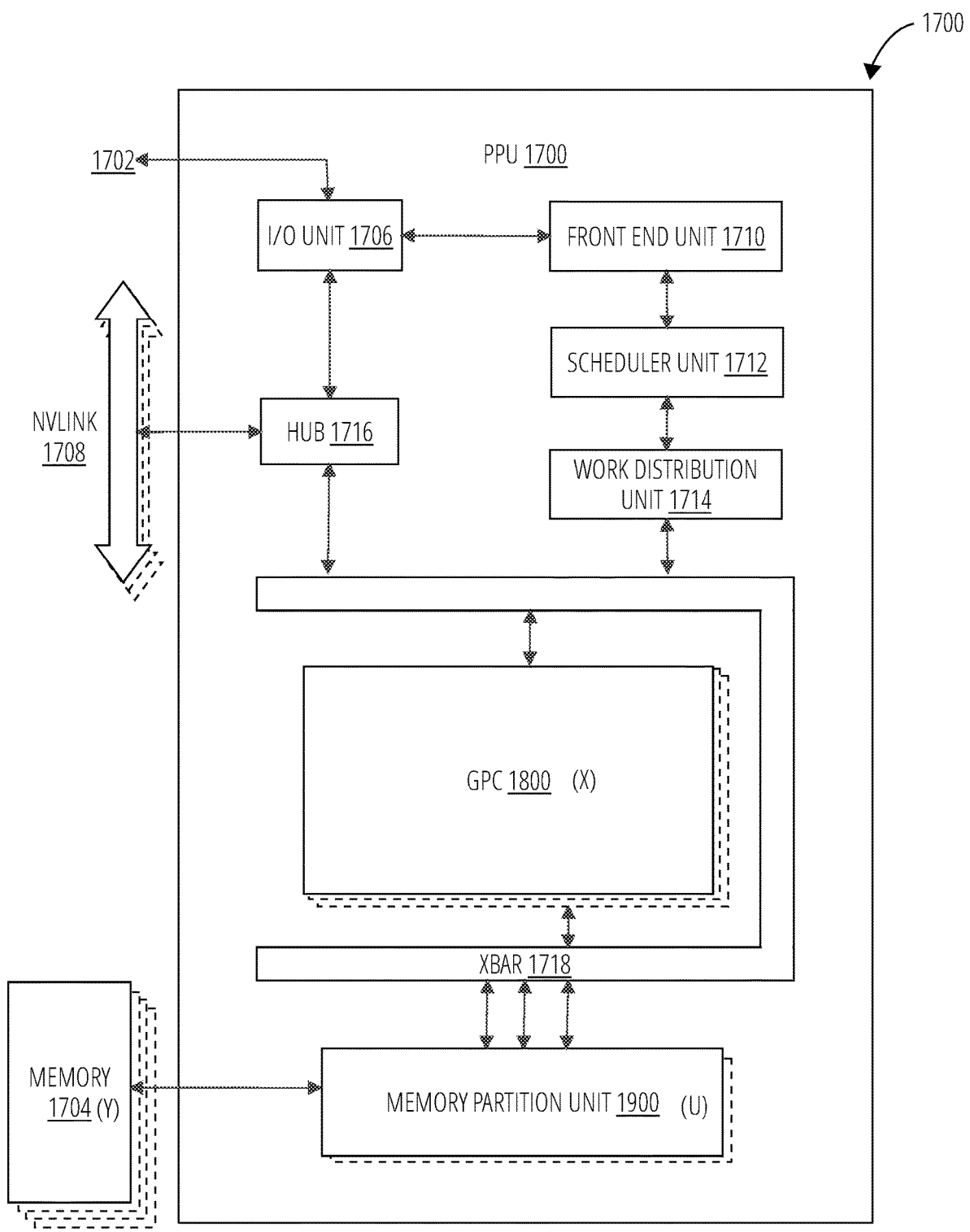
FIG. 17 illustrates a parallel processing unit 1700 in accordance with one embodiment.

FIG. 17 illustrates a parallel processing unit 1700, in accordance with an embodiment. In an embodiment, the parallel processing unit 1700 is a multi-threaded processor that is implemented on one or more integrated circuit devices. The parallel processing unit 1700 is a latency hiding architecture designed to process many threads in parallel. A thread (e.g., a thread of execution) is an instantiation of a set of instructions configured to be executed by the parallel processing unit 1700. In an embodiment, the parallel processing unit 1700 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the parallel processing unit 1700 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more parallel processing unit 1700 modules may be configured to accelerate thousands of High Performance Computing (HPC), data center, and machine learning applications. The parallel processing unit 1700 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 17, the parallel processing unit 1700 includes an I/O unit 1706, a front end unit 1710, a scheduler unit 1712, a work distribution unit 1714, a hub 1716, a crossbar 1718, one or more GPC 1800 modules, and one or more memory partition unit 1900 modules. The parallel processing unit 1700 may be connected to a host processor or other parallel processing unit 1700 modules via one or more high-speed NVLink 1708 interconnects. The parallel processing unit 1700 may be connected to a host processor or other peripheral devices via an interconnect 1702. The parallel processing unit 1700 may also be connected to a local memory comprising a number of memory 1704 devices. In an embodiment, the local memory may comprise a number of dynamic random access memory (DRAM) devices. The DRAM devices may be configured as a high-bandwidth memory (HBM) subsystem, with multiple DRAM dies stacked within each device. The memory 1704 may comprise logic to configure the parallel processing unit 1700 to carry out aspects of the techniques disclosed herein.

The NVLink 1708 interconnect enables systems to scale and include one or more parallel processing unit 1700 modules combined with one or more CPUs, supports cache coherence between the parallel processing unit 1700 modules and CPUs, and CPU mastering. Data and/or commands may be transmitted by the NVLink 1708 through the hub 1716 to/from other units of the parallel processing unit 1700 such as one or more copy engines, a video encoder, a video decoder, a power management unit, etc. (not explicitly shown). The NVLink 1708 is described in more detail in conjunction with FIG. 21.

The I/O unit 1706 is configured to transmit and receive communications (e.g., commands, data, etc.) from a host processor (not shown) over the interconnect 1702. The I/O unit 1706 may communicate with the host processor directly via the interconnect 1702 or through one or more intermediate devices such as a memory bridge. In an embodiment, the I/O unit 1706 may communicate with one or more other processors, such as one or more parallel processing unit 1700 modules via the interconnect 1702. In an embodiment, the I/O unit 1706 implements a Peripheral Component Interconnect Express (PCIe) interface for communications over a PCIe bus and the interconnect 1702 is a PCIe bus. In alternative embodiments, the I/O unit 1706 may implement other types of well-known interfaces for communicating with external devices.

The I/O unit 1706 decodes packets received via the interconnect 1702. In an embodiment, the packets represent commands configured to cause the parallel processing unit 1700 to perform various operations. The I/O unit 1706 transmits the decoded commands to various other units of the parallel processing unit 1700 as the commands may specify. For example, some commands may be transmitted to the front end unit 1710. Other commands may be transmitted to the hub 1716 or other units of the parallel processing unit 1700 such as one or more copy engines, a video encoder, a video decoder, a power management unit, etc. (not explicitly shown). In other words, the I/O unit 1706 is configured to route communications between and among the various logical units of the parallel processing unit 1700.

In an embodiment, a program executed by the host processor encodes a command stream in a buffer that provides workloads to the parallel processing unit 1700 for processing. A workload may comprise several instructions and data to be processed by those instructions. The buffer is a region in a memory that is accessible (e.g., read/write) by both the host processor and the parallel processing unit 1700. For example, the I/O unit 1706 may be configured to access the buffer in a system memory connected to the interconnect 1702 via memory requests transmitted over the interconnect 1702. In an embodiment, the host processor writes the command stream to the buffer and then transmits a pointer to the start of the command stream to the parallel processing unit 1700. The front end unit 1710 receives pointers to one or more command streams. The front end unit 1710 manages the one or more streams, reading commands from the streams and forwarding commands to the various units of the parallel processing unit 1700.

The front end unit 1710 is coupled to a scheduler unit 1712 that configures the various GPC 1800 modules to process tasks defined by the one or more streams. The scheduler unit 1712 is configured to track state information related to the various tasks managed by the scheduler unit 1712. The state may indicate which GPC 1800 a task is assigned to, whether the task is active or inactive, a priority level associated with the task, and so forth. The scheduler unit 1712 manages the execution of a plurality of tasks on the one or more GPC 1800 modules.

The scheduler unit 1712 is coupled to a work distribution unit 1714 that is configured to dispatch tasks for execution on the GPC 1800 modules. The work distribution unit 1714 may track a number of scheduled tasks received from the scheduler unit 1712. In an embodiment, the work distribution unit 1714 manages a pending task pool and an active task pool for each of the GPC 1800 modules. The pending task pool may comprise a number of slots (e.g., 32 slots) that contain tasks assigned to be processed by a particular GPC 1800. The active task pool may comprise a number of slots (e.g., 4 slots) for tasks that are actively being processed by the GPC 1800 modules. As a GPC 1800 finishes the execution of a task, that task is evicted from the active task pool for the GPC 1800 and one of the other tasks from the pending task pool is selected and scheduled for execution on the GPC 1800. If an active task has been idle on the GPC 1800, such as while waiting for a data dependency to be resolved, then the active task may be evicted from the GPC 1800 and returned to the pending task pool while another task in the pending task pool is selected and scheduled for execution on the GPC 1800.

The work distribution unit 1714 communicates with the one or more GPC 1800 modules via crossbar 1718. The crossbar 1718 is an interconnect network that couples many of the units of the parallel processing unit 1700 to other units of the parallel processing unit 1700. For example, the crossbar 1718 may be configured to couple the work distribution unit 1714 to a particular GPC 1800. Although not shown explicitly, one or more other units of the parallel processing unit 1700 may also be connected to the crossbar 1718 via the hub 1716.

The tasks are managed by the scheduler unit 1712 and dispatched to a GPC 1800 by the work distribution unit 1714. The GPC 1800 is configured to process the task and generate results. The results may be consumed by other tasks within the GPC 1800, routed to a different GPC 1800 via the crossbar 1718, or stored in the memory 1704. The results can be written to the memory 1704 via the memory partition unit 1900 modules, which implement a memory interface for reading and writing data to/from the memory 1704. The results can be transmitted to another parallel processing unit 1700 or CPU via the NVLink 1708. In an embodiment, the parallel processing unit 1700 includes a number U of memory partition unit 1900 modules that is equal to the number of separate and distinct memory 1704 devices coupled to the parallel processing unit 1700. A memory partition unit 1900 will be described in more detail below in conjunction with FIG. 19.

In an embodiment, a host processor executes a driver kernel that implements an application programming interface (API) that enables one or more applications executing on the host processor to schedule operations for execution on the parallel processing unit 1700. In an embodiment, multiple compute applications are simultaneously executed by the parallel processing unit 1700 and the parallel processing unit 1700 provides isolation, quality of service (QoS), and independent address spaces for the multiple compute applications. An application may generate instructions (e.g., API calls) that cause the driver kernel to generate one or more tasks for execution by the parallel processing unit 1700. The driver kernel outputs tasks to one or more streams being processed by the parallel processing unit 1700. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 20.

Figure 18:
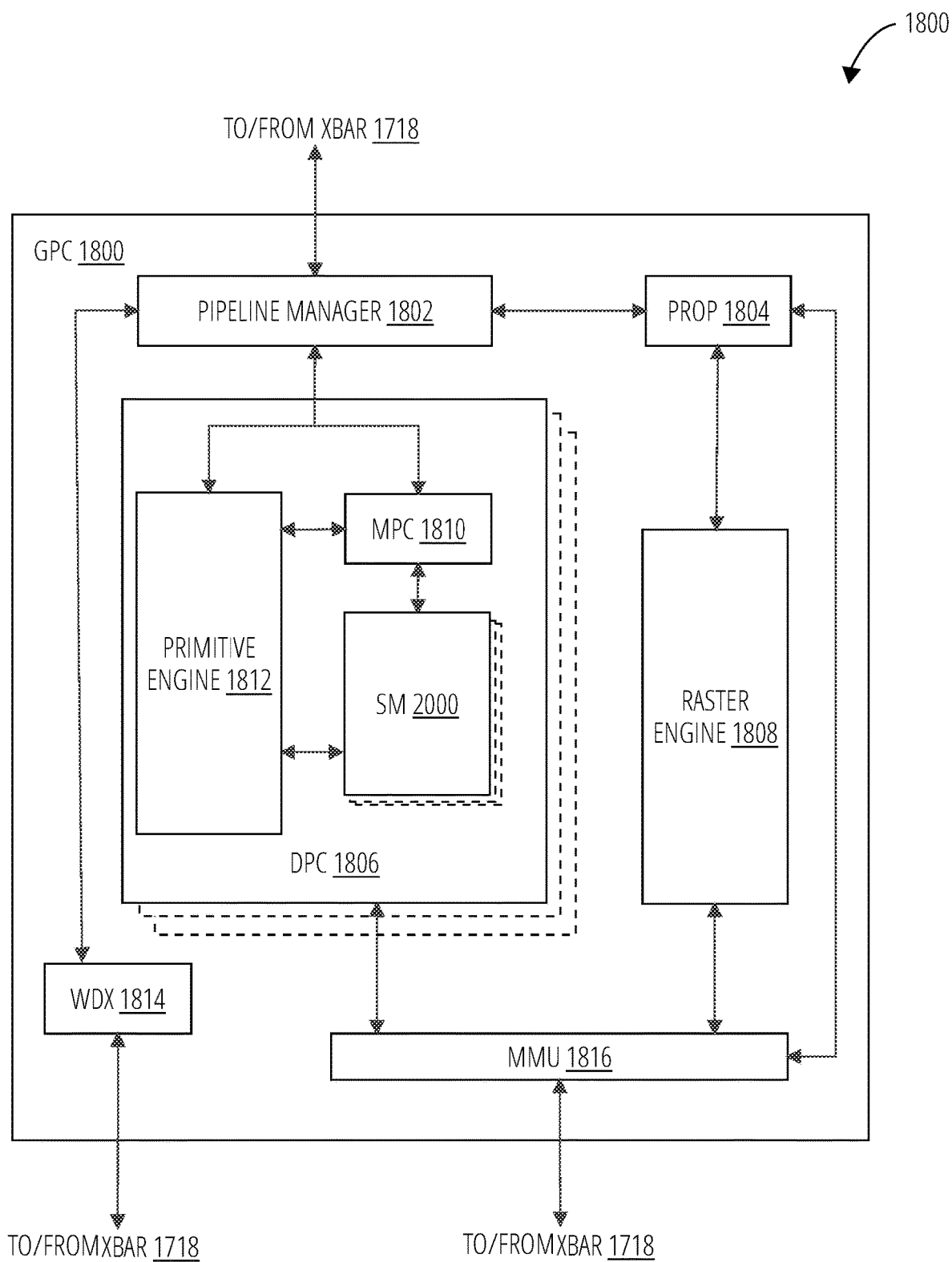
FIG. 18 illustrates a GPC 1800 in accordance with one embodiment.

FIG. 18 illustrates a GPC 1800 of the parallel processing unit 1700 of FIG. 17, in accordance with an embodiment. As shown in FIG. 18, each GPC 1800 includes a number of hardware units for processing tasks. In an embodiment, each GPC 1800 includes a pipeline manager 1802, a PROP 1804, a raster engine 1808, a WDX 1814, an MMU 1816, and one or more DPC 1806. It will be appreciated that the GPC 1800 of FIG. 18 may include other hardware units in lieu of or in addition to the units shown in FIG. 18.

In an embodiment, the operation of the GPC 1800 is controlled by the pipeline manager 1802. The pipeline manager 1802 manages the configuration of the one or more DPC 1806 modules for processing tasks allocated to the GPC 1800. In an embodiment, the pipeline manager 1802 may configure at least one of the one or more DPC 1806 modules to implement at least a portion of a graphics rendering pipeline. For example, a DPC 1806 may be configured to execute a vertex shader program on the programmable SM 2000. The pipeline manager 1802 may also be configured to route packets received from the work distribution unit 1714 to the appropriate logical units within the GPC 1800. For example, some packets may be routed to fixed function hardware units in the PROP 1804 and/or raster engine 1808 while other packets may be routed to the DPC 1806 modules for processing by the primitive engine 1812 or the SM 2000. In an embodiment, the pipeline manager 1802 may configure at least one of the one or more DPC 1806 modules to implement a neural network model and/or a computing pipeline.

Figure 19:
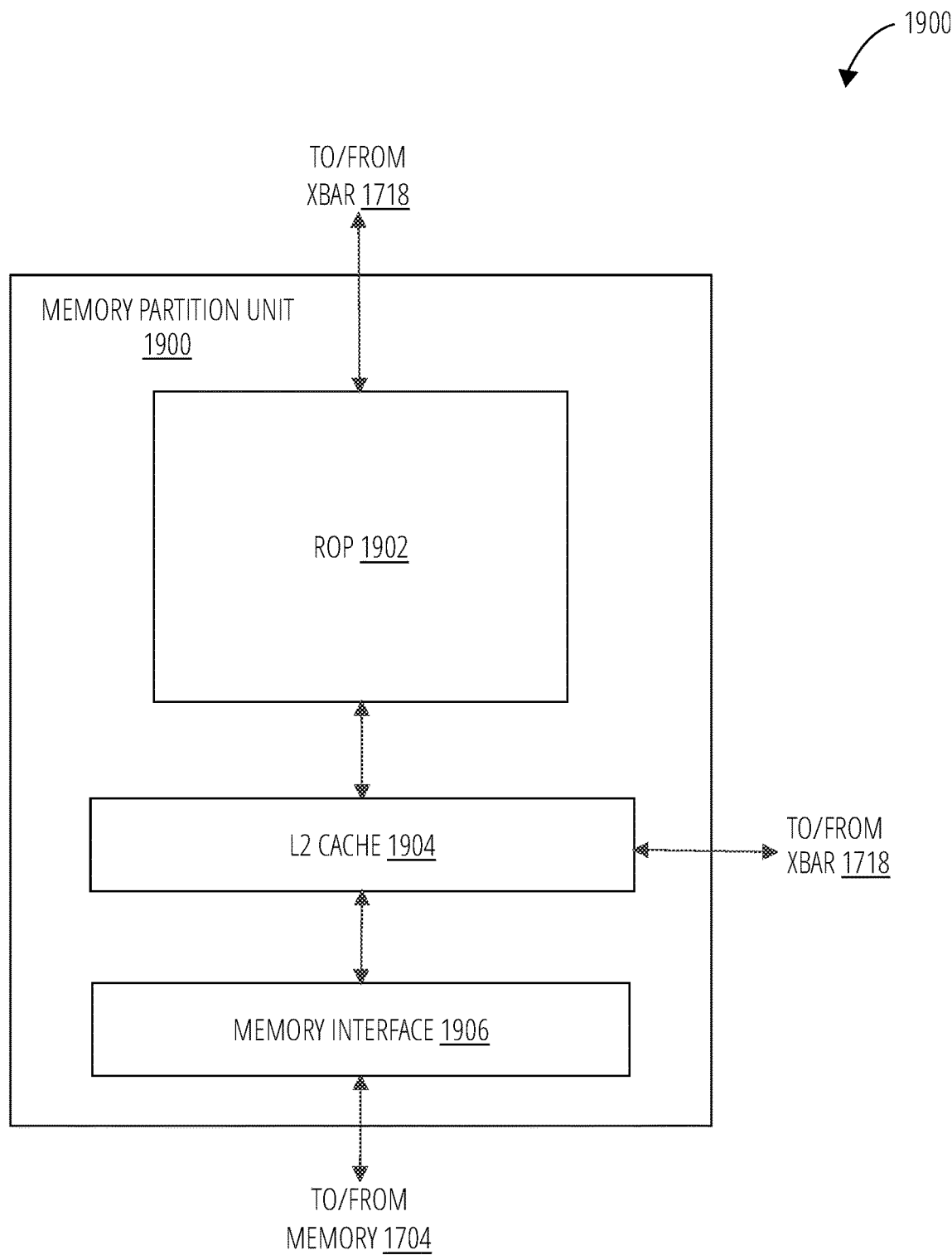
FIG. 19 illustrates a memory partition unit 1900 in accordance with one embodiment.

The PROP 1804 is configured to route data generated by the raster engine 1808 and the DPC 1806 modules to a Raster Operations (ROP) unit, described in more detail in conjunction with FIG. 19. The PROP 1804 may also be configured to perform optimizations for color blending, organize pixel data, perform address translations, and the like.

The raster engine 1808 includes a number of fixed-function hardware units configured to perform various raster operations. In an embodiment, the raster engine 1808 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x, y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 1808 comprises fragments to be processed, for example, by a fragment shader implemented within a DPC 1806.

Each DPC 1806 included in the GPC 1800 includes an MPC 1810, a primitive engine 1812, and one or more SM 2000 modules. The MPC 1810 controls the operation of the DPC 1806, routing packets received from the pipeline manager 1802 to the appropriate units in the DPC 1806. For example, packets associated with a vertex may be routed to the primitive engine 1812, which is configured to fetch vertex attributes associated with the vertex from the memory 1704. In contrast, packets associated with a shader program may be transmitted to the SM 2000.

The SM 2000 comprises a programmable streaming processor that is configured to process tasks represented by a number of threads. Each SM 2000 is multi-threaded and configured to execute a plurality of threads (e.g., 32 threads) from a particular group of threads concurrently. In an embodiment, the SM 2000 implements a Single-Instruction, Multiple-Data (SIMD) architecture where each thread in a group of threads (e.g., a warp) is configured to process a different set of data based on the same set of instructions. All threads in the group of threads execute the same instructions. In another embodiment, the SM 2000 implements a Single-Instruction, Multiple Thread (SIMT) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The SM 2000 will be described in more detail below in conjunction with FIG. 20.

The MMU 1816 provides an interface between the GPC 1800 and the memory partition unit 1900. The MMU 1816 may provide translation of virtual addresses into physical addresses, memory protection, and arbitration of memory requests. In an embodiment, the MMU 1816 provides one or more translation lookaside buffers (TLBs) for performing translation of virtual addresses into physical addresses in the memory 1704.

FIG. 19 illustrates a memory partition unit 1900 of the parallel processing unit 1700 of FIG. 17, in accordance with an embodiment. As shown in FIG. 19, the memory partition unit 1900 includes a ROP 1902, an L2 cache 1904, and a memory interface 1906. The memory interface 1906 is coupled to the memory 1704. Memory interface 1906 may implement 32, 64, 128, 1024-bit data buses, or the like, for high-speed data transfer. In an embodiment, the parallel processing unit 1700 incorporates U memory interface 1906 modules, one memory interface 1906 per pair of memory partition unit 1900 modules, where each pair of memory partition unit 1900 modules is connected to a corresponding memory 1704 device. For example, parallel processing unit 1700 may be connected to up to Y memory 1704 devices, such as high bandwidth memory stacks or graphics double-data-rate, version 5, synchronous dynamic random access memory, or other types of persistent storage.

In an embodiment, the memory interface 1906 implements an HBM2 memory interface and Y equals half U. In an embodiment, the HBM2 memory stacks are located on the same physical package as the parallel processing unit 1700, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 1704 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where parallel processing unit 1700 modules process very large datasets and/or run applications for extended periods.

In an embodiment, the parallel processing unit 1700 implements a multi-level memory hierarchy. In an embodiment, the memory partition unit 1900 supports a unified memory to provide a single unified virtual address space for CPU and parallel processing unit 1700 memory, enabling data sharing between virtual memory systems. In an embodiment the frequency of accesses by a parallel processing unit 1700 to memory located on other processors is traced to ensure that memory pages are moved to the physical memory of the parallel processing unit 1700 that is accessing the pages more frequently. In an embodiment, the NVLink 1708 supports address translation services allowing the parallel processing unit 1700 to directly access a CPU's page tables and providing full access to CPU memory by the parallel processing unit 1700.

In an embodiment, copy engines transfer data between multiple parallel processing unit 1700 modules or between parallel processing unit 1700 modules and CPUs. The copy engines can generate page faults for addresses that are not mapped into the page tables. The memory partition unit 1900 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 1704 or other system memory may be fetched by the memory partition unit 1900 and stored in the L2 cache 1904, which is located on-chip and is shared between the various GPC 1800 modules. As shown, each memory partition unit 1900 includes a portion of the L2 cache 1904 associated with a corresponding memory 1704 device. Lower level caches may then be implemented in various units within the GPC 1800 modules. For example, each of the SM 2000 modules may implement an L1 cache. The L1 cache is private memory that is dedicated to a particular SM 2000. Data from the L2 cache 1904 may be fetched and stored in each of the L1 caches for processing in the functional units of the SM 2000 modules. The L2 cache 1904 is coupled to the memory interface 1906 and the crossbar 1718.

The ROP 1902 performs graphics raster operations related to pixel color, such as color compression, pixel blending, and the like. The ROP 1902 also implements depth testing in conjunction with the raster engine 1808, receiving a depth for a sample location associated with a pixel fragment from the culling engine of the raster engine 1808. The depth is tested against a corresponding depth in a depth buffer for a sample location associated with the fragment. If the fragment passes the depth test for the sample location, then the ROP 1902 updates the depth buffer and transmits a result of the depth test to the raster engine 1808. It will be appreciated that the number of partition memory partition unit 1900 modules may be different than the number of GPC 1800 modules and, therefore, each ROP 1902 may be coupled to each of the GPC 1800 modules. The ROP 1902 tracks packets received from the different GPC 1800 modules and determines which GPC 1800 that a result generated by the ROP 1902 is routed to through the crossbar 1718. Although the ROP 1902 is included within the memory partition unit 1900 in FIG. 19, in other embodiment, the ROP 1902 may be outside of the memory partition unit 1900. For example, the ROP 1902 may reside in the GPC 1800 or another unit.

Figure 20:
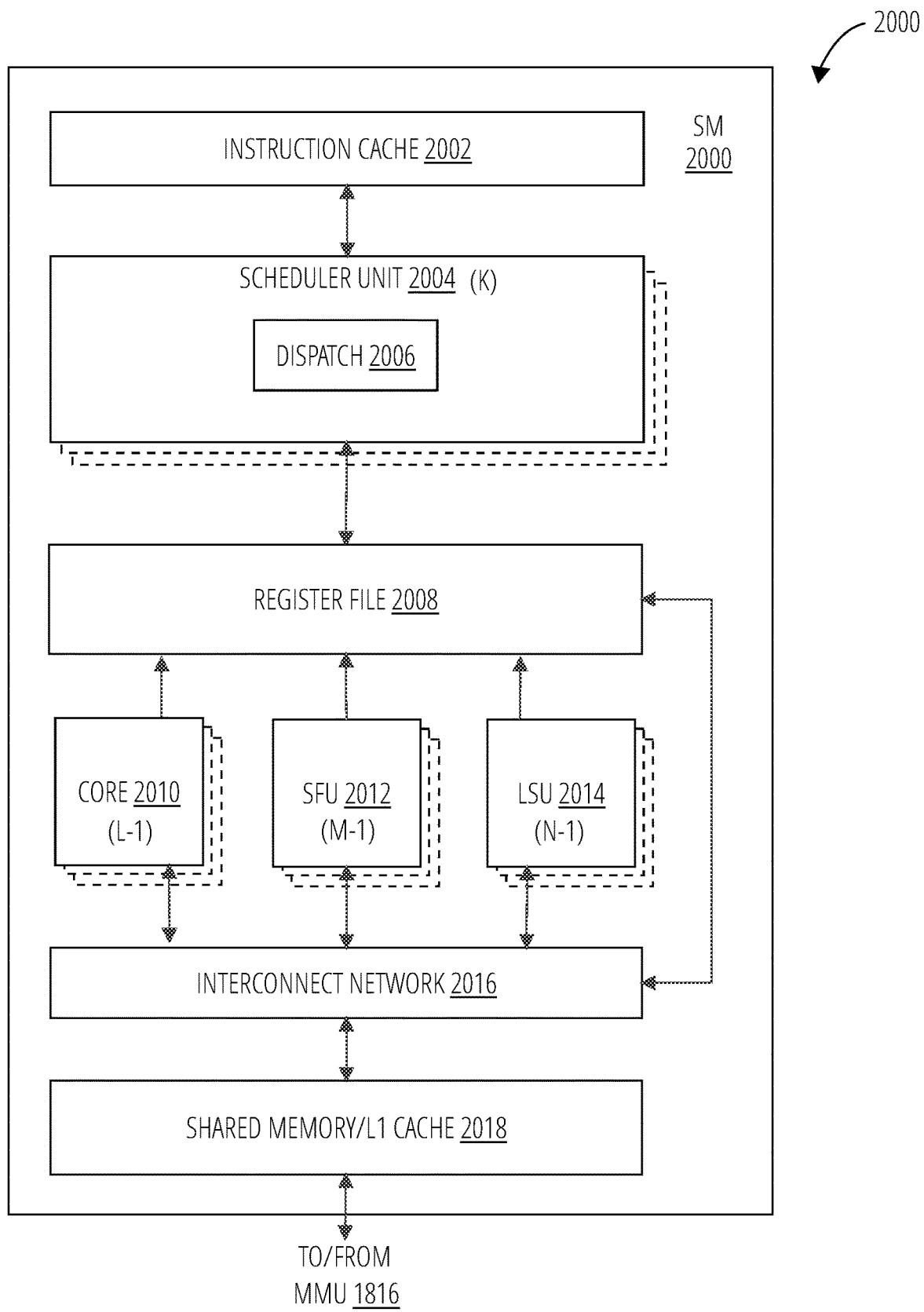
FIG. 20 illustrates an SM 2000 in accordance with one embodiment.

FIG. 20 illustrates the SM 2000 of FIG. 18, in accordance with an embodiment. As shown in FIG. 20, the SM 2000 includes an instruction cache 2002, one or more scheduler unit 2004 modules (e.g., such as scheduler unit 1712), a register file 2008, one or more processing core 2010 modules, one or more SFU 2012 modules, one or more LSU 2014 modules, an interconnect network 2016, and a shared memory/L1 cache 2018.

As described above, the work distribution unit 1714 dispatches tasks for execution on the GPC 1800 modules of the parallel processing unit 1700. The tasks are allocated to a particular DPC 1806 within a GPC 1800 and, if the task is associated with a shader program, the task may be allocated to an SM 2000. The scheduler unit 1712 receives the tasks from the work distribution unit 1714 and manages instruction scheduling for one or more thread blocks assigned to the SM 2000. The scheduler unit 2004 schedules thread blocks for execution as warps of parallel threads, where each thread block is allocated at least one warp. In an embodiment, each warp executes 32 threads. The scheduler unit 2004 may manage a plurality of different thread blocks, allocating the warps to the different thread blocks and then dispatching instructions from the plurality of different cooperative groups to the various functional units (e.g., core 2010 modules, SFU 2012 modules, and LSU 2014 modules) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch 2006 unit is configured within the scheduler unit 2004 to transmit instructions to one or more of the functional units. In one embodiment, the scheduler unit 2004 includes two dispatch 2006 units that enable two different instructions from the same warp to be dispatched during each clock cycle. In alternative embodiments, each scheduler unit 2004 may include a single dispatch 2006 unit or additional dispatch 2006 units.

Each SM 2000 includes a register file 2008 that provides a set of registers for the functional units of the SM 2000. In an embodiment, the register file 2008 is divided between each of the functional units such that each functional unit is allocated a dedicated portion of the register file 2008. In another embodiment, the register file 2008 is divided between the different warps being executed by the SM 2000. The register file 2008 provides temporary storage for operands connected to the data paths of the functional units.

Each SM 2000 comprises L processing core 2010 modules. In an embodiment, the SM 2000 includes a large number (e.g., 128, etc.) of distinct processing core 2010 modules. Each core 2010 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the core 2010 modules include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the core 2010 modules. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A'B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each SM 2000 also comprises M SFU 2012 modules that perform special functions (e.g., attribute evaluation, reciprocal square root, and the like). In an embodiment, the SFU 2012 modules may include a tree traversal unit configured to traverse a hierarchical tree data structure. In an embodiment, the SFU 2012 modules may include texture unit configured to perform texture map filtering operations. In an embodiment, the texture units are configured to load texture maps (e.g., a 2D array of texels) from the memory 1704 and sample the texture maps to produce sampled texture values for use in shader programs executed by the SM 2000. In an embodiment, the texture maps are stored in the shared memory/L1 cache 2018. The texture units implement texture operations such as filtering operations using mip-maps (e.g., texture maps of varying levels of detail). In an embodiment, each SM 2000 includes two texture units.

Each SM 2000 also comprises N LSU 2014 modules that implement load and store operations between the shared memory/L1 cache 2018 and the register file 2008. Each SM 2000 includes an interconnect network 2016 that connects each of the functional units to the register file 2008 and the LSU 2014 to the register file 2008 and shared memory/L1 cache 2018. In an embodiment, the interconnect network 2016 is a crossbar that can be configured to connect any of the functional units to any of the registers in the register file 2008 and connect the LSU 2014 modules to the register file 2008 and memory locations in shared memory/L1 cache 2018.

The shared memory/L1 cache 2018 is an array of on-chip memory that allows for data storage and communication between the SM 2000 and the primitive engine 1812 and between threads in the SM 2000. In an embodiment, the shared memory/L1 cache 2018 comprises 128 KB of storage capacity and is in the path from the SM 2000 to the memory partition unit 1900. The shared memory/L1 cache 2018 can be used to cache reads and writes. One or more of the shared memory/L1 cache 2018, L2 cache 1904, and memory 1704 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 2018 enables the shared memory/L1 cache 2018 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 17, are bypassed, creating a much simpler programming model. In the general purpose parallel computation configuration, the work distribution unit 1714 assigns and distributes blocks of threads directly to the DPC 1806 modules. The threads in a block execute the same program, using a unique thread ID in the calculation to ensure each thread generates unique results, using the SM 2000 to execute the program and perform calculations, shared memory/L1 cache 2018 to communicate between threads, and the LSU 2014 to read and write global memory through the shared memory/L1 cache 2018 and the memory partition unit 1900. When configured for general purpose parallel computation, the SM 2000 can also write commands that the scheduler unit 1712 can use to launch new work on the DPC 1806 modules.

The parallel processing unit 1700 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the parallel processing unit 1700 is embodied on a single semiconductor substrate. In another embodiment, the parallel processing unit 1700 is included in a system-on-a-chip (SoC) along with one or more other devices such as additional parallel processing unit 1700 modules, the memory 1704, a reduced instruction set computer (RISC) CPU, a memory management unit (MMU), a digital-to-analog converter (DAC), and the like.

In an embodiment, the parallel processing unit 1700 may be included on a graphics card that includes one or more memory devices 304. The graphics card may be configured to interface with a PCIe slot on a motherboard of a desktop computer. In yet another embodiment, the parallel processing unit 1700 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 21:
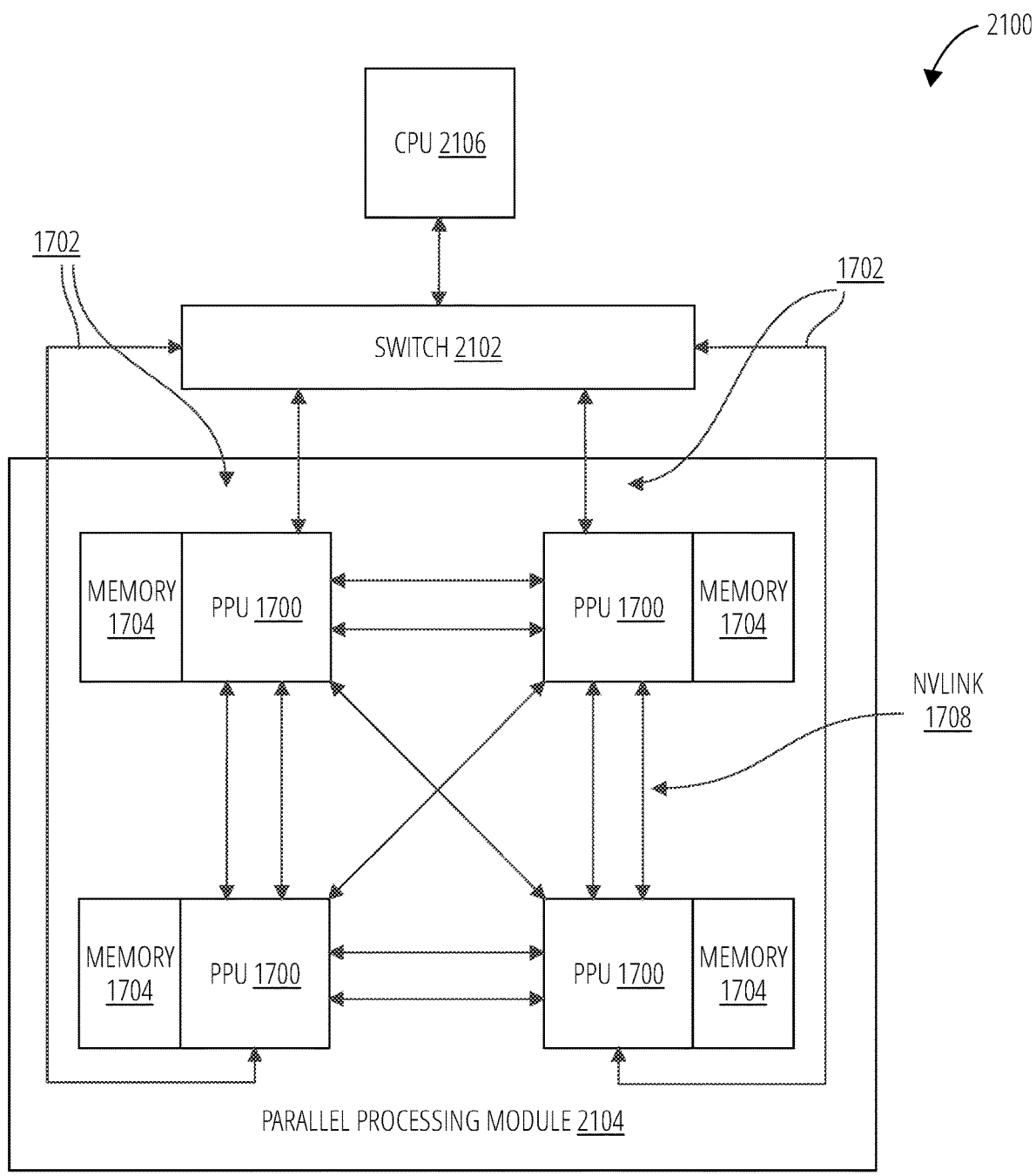
FIG. 21 illustrates a processing system 2100 in accordance with one embodiment.

FIG. 21 is a conceptual diagram of a processing system 2100 implemented using the parallel processing unit 1700 of FIG. 17, in accordance with an embodiment. The processing system 2100 includes a CPU 2106, switch 2102, and multiple parallel processing unit 1700 modules each and respective memory 1704 modules. The NVLink 1708 provides high-speed communication links between each of the parallel processing unit 1700 modules. Although a particular number of NVLink 1708 and interconnect 1702 connections are illustrated in FIG. 21, the number of connections to each parallel processing unit 1700 and the CPU 2106 may vary. The switch 2102 interfaces between the interconnect 1702 and the CPU 2106. The parallel processing unit 1700 modules, memory 1704 modules, and NVLink 1708 connections may be situated on a single semiconductor platform to form a parallel processing module 2104. In an embodiment, the switch 2102 supports two or more protocols to interface between various different connections and/or links.

In another embodiment (not shown), the NVLink 1708 provides one or more high-speed communication links between each of the parallel processing unit 1700 modules and the CPU 2106 and the switch 2102 interfaces between the interconnect 1702 and each of the parallel processing unit 1700 modules. The parallel processing unit 1700 modules, memory 1704 modules, and interconnect 1702 may be situated on a single semiconductor platform to form a parallel processing module 2104. In yet another embodiment (not shown), the interconnect 1702 provides one or more communication links between each of the parallel processing unit 1700 modules and the CPU 2106 and the switch 2102 interfaces between each of the parallel processing unit 1700 modules using the NVLink 1708 to provide one or more high-speed communication links between the parallel processing unit 1700 modules. In another embodiment (not shown), the NVLink 1708 provides one or more high-speed communication links between the parallel processing unit 1700 modules and the CPU 2106 through the switch 2102. In yet another embodiment (not shown), the interconnect 1702 provides one or more communication links between each of the parallel processing unit 1700 modules directly. One or more of the NVLink 1708 high-speed communication links may be implemented as a physical NVLink interconnect or either an on-chip or on-die interconnect using the same protocol as the NVLink 1708.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 2104 may be implemented as a circuit board substrate and each of the parallel processing unit 1700 modules and/or memory 1704 modules may be packaged devices. In an embodiment, the CPU 2106, switch 2102, and the parallel processing module 2104 are situated on a single semiconductor platform.

In an embodiment, the signaling rate of each NVLink 1708 is 20 to 25 Gigabits/second and each parallel processing unit 1700 includes six NVLink 1708 interfaces (as shown in FIG. 21, five NVLink 1708 interfaces are included for each parallel processing unit 1700). Each NVLink 1708 provides a data transfer rate of 25 Gigabytes/second in each direction, with six links providing 300 Gigabytes/second. The NVLink 1708 can be used exclusively for PPU-to-PPU communication as shown in FIG. 21, or some combination of PPU-to-PPU and PPU-to-CPU, when the CPU 2106 also includes one or more NVLink 1708 interfaces.

In an embodiment, the NVLink 1708 allows direct load/store/atomic access from the CPU 2106 to each parallel processing unit 1700 module's memory 1704. In an embodiment, the NVLink 1708 supports coherency operations, allowing data read from the memory 1704 modules to be stored in the cache hierarchy of the CPU 2106, reducing cache access latency for the CPU 2106. In an embodiment, the NVLink 1708 includes support for Address Translation Services (ATS), allowing the parallel processing unit 1700 to directly access page tables within the CPU 2106. One or more of the NVLink 1708 may also be configured to operate in a low-power mode.

Figure 22:
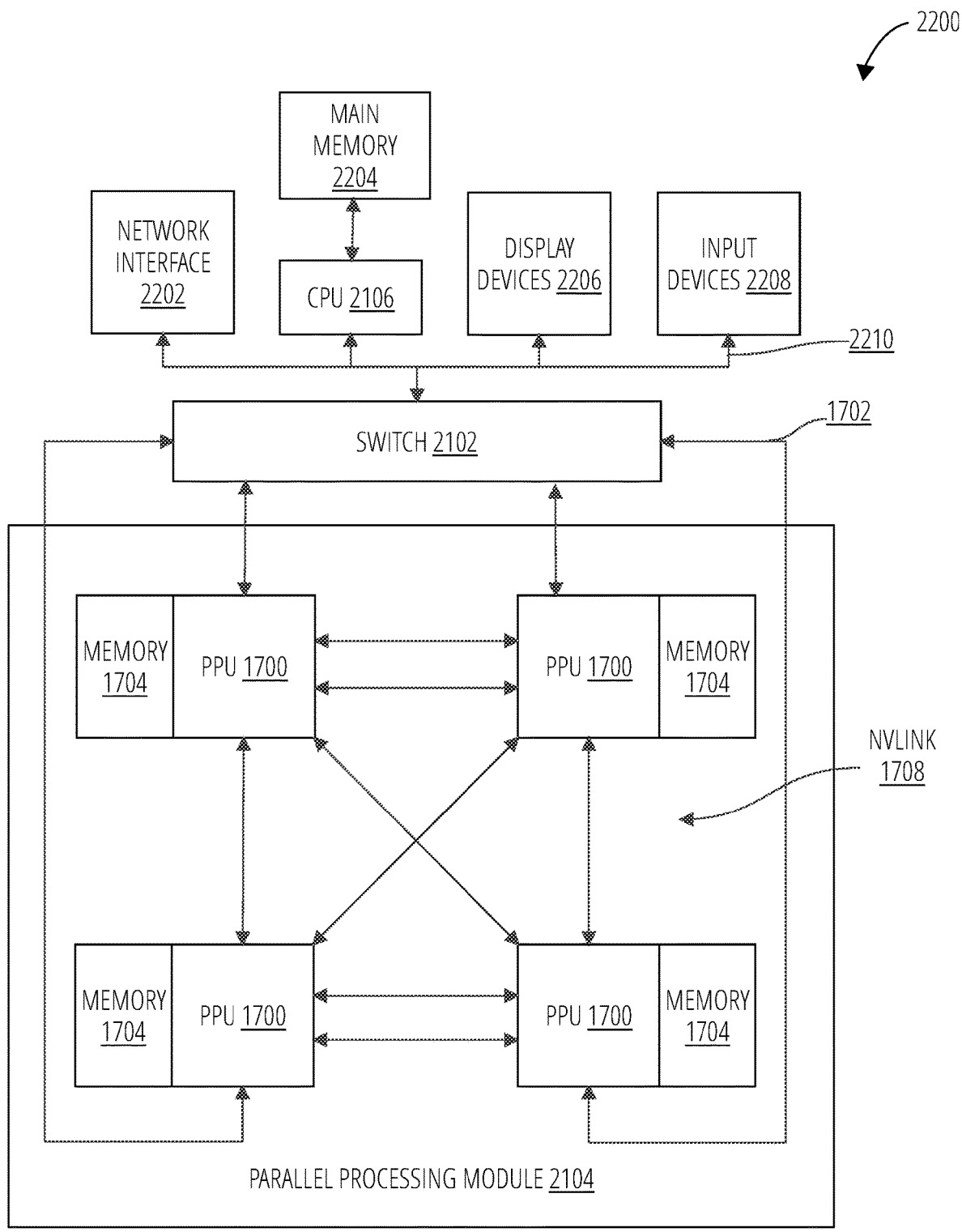
FIG. 22 illustrates an exemplary processing system 2200 in accordance with one embodiment.

FIG. 22 illustrates an exemplary processing system 2200 in which the various architecture and/or functionality of the various previous embodiments may be implemented. As shown, an exemplary processing system 2200 is provided including at least one CPU 2106 that is connected to a communication communications bus 2210. The communication communications bus 2210 may be implemented using any suitable protocol, such as PCI (Peripheral Component Interconnect), PCI-Express, AGP (Accelerated Graphics Port), HyperTransport, or any other bus or point-to-point communication protocol(s). The exemplary processing system 2200 also includes a main memory 2204. Control logic (software) and data are stored in the main memory 2204 which may take the form of random access memory (RAM).

The exemplary processing system 2200 also includes input devices 2208, the parallel processing module 2104, and display devices 2206, e.g. a conventional CRT (cathode ray tube), LCD (liquid crystal display), LED (light emitting diode), plasma display or the like. User input may be received from the input devices 2208, e.g., keyboard, mouse, touchpad, microphone, and the like. Each of the foregoing modules and/or devices may even be situated on a single semiconductor platform to form the exemplary processing system 2200. Alternately, the various modules may also be situated separately or in various combinations of semiconductor platforms per the desires of the user.

Further, the exemplary processing system 2200 may be coupled to a network (e.g., a telecommunications network, local area network (LAN), wireless network, wide area network (WAN) such as the Internet, peer-to-peer network, cable network, or the like) through a network interface 2202 for communication purposes.

The exemplary processing system 2200 may also include a secondary storage (not shown). The secondary storage includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 2204 and/or the secondary storage. Such computer programs, when executed, enable the exemplary processing system 2200 to perform various functions. The main memory 2204, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the exemplary processing system 2200 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Graphics Processing Pipeline

FIG. 22 is a conceptual diagram of a graphics processing pipeline 2300 implemented by the parallel processing unit 1700 of FIG. 17, in accordance with an embodiment. In an embodiment, the parallel processing unit 1700 comprises a graphics processing unit (GPU). The parallel processing unit 1700 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The parallel processing unit 1700 can be configured to process the graphics primitives to generate a frame buffer (e.g., pixel data for each of the pixels of the display).

An application writes model data for a scene (e.g., a collection of vertices and attributes) to a memory such as a system memory or memory 1704. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the SM 2000 modules of the parallel processing unit 1700 including one or more of a vertex shader, hull shader, domain shader, geometry shader, and a pixel shader. For example, one or more of the SM 2000 modules may be configured to execute a vertex shader program that processes a number of vertices defined by the model data. In an embodiment, the different SM 2000 modules may be configured to execute different shader programs concurrently. For example, a first subset of SM 2000 modules may be configured to execute a vertex shader program while a second subset of SM 2000 modules may be configured to execute a pixel shader program. The first subset of SM 2000 modules processes vertex data to produce processed vertex data and writes the processed vertex data to the L2 cache 1904 and/or the memory 1704. After the processed vertex data is rasterized (e.g., transformed from three-dimensional data into two-dimensional data in screen space) to produce fragment data, the second subset of SM 2000 modules executes a pixel shader to produce processed fragment data, which is then blended with other processed fragment data and written to the frame buffer in memory 1704. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The graphics processing pipeline 2300 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 2300 receives input data 601 that is transmitted from one stage to the next stage of the graphics processing pipeline 2300 to generate output data 2304. In an embodiment, the graphics processing pipeline 2300 may represent a graphics processing pipeline defined by the OpenGL® API. As an option, the graphics processing pipeline 2300 may be implemented in the context of the functionality and architecture of the previous Figures and/or any subsequent Figure(s).

Figure 23:
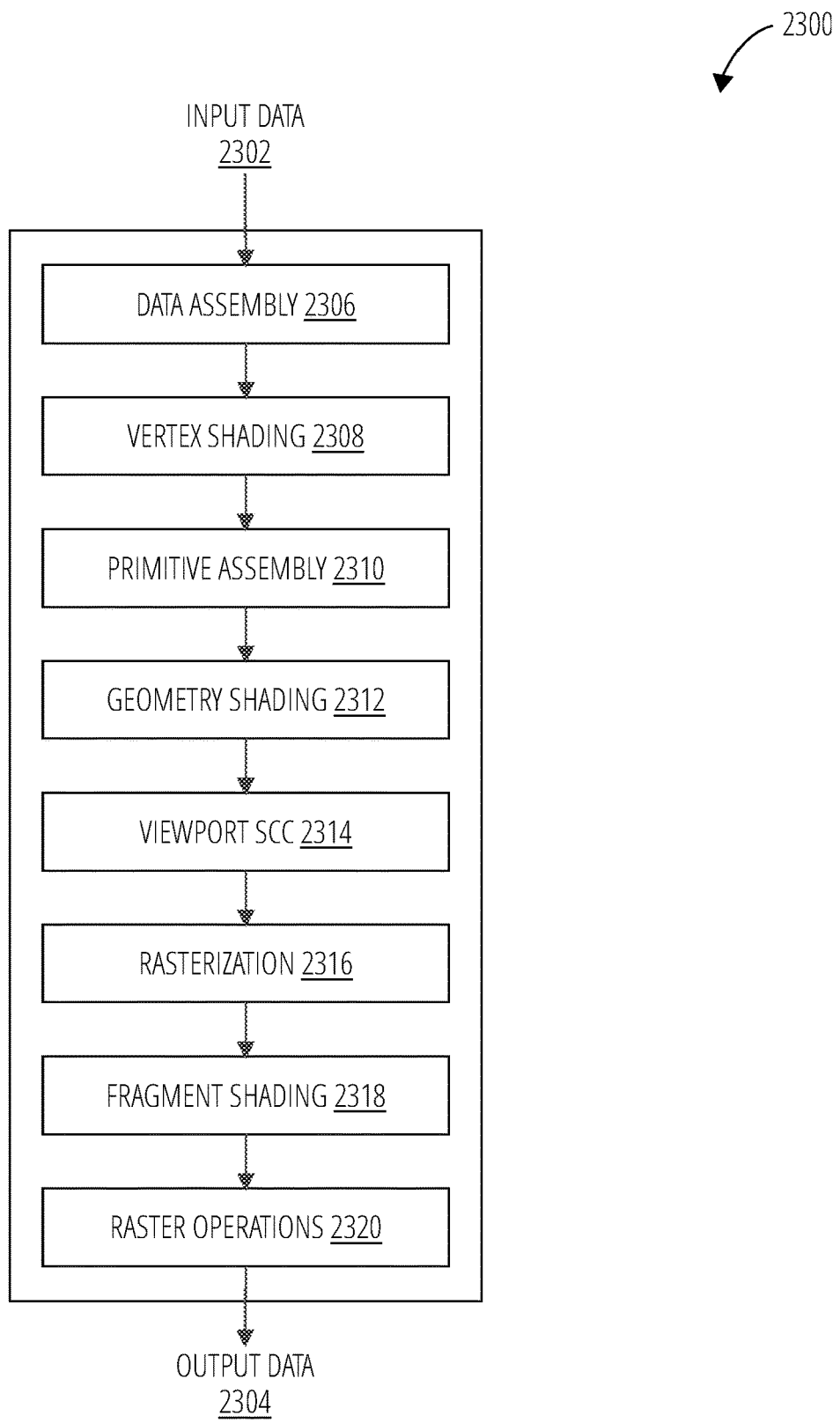
FIG. 23 illustrates a graphics processing pipeline 2300 in accordance with one embodiment.

As shown in FIG. 23, the graphics processing pipeline 2300 comprises a pipeline architecture that includes a number of stages. The stages include, but are not limited to, a data assembly 2306 stage, a vertex shading 2308 stage, a primitive assembly 2310 stage, a geometry shading 2312 stage, a viewport SCC 2314 stage, a rasterization 2316 stage, a fragment shading 2318 stage, and a raster operations 2320 stage. In an embodiment, the input data 2302 comprises commands that configure the processing units to implement the stages of the graphics processing pipeline 2300 and geometric primitives (e.g., points, lines, triangles, quads, triangle strips or fans, etc.) to be processed by the stages. The output data 2304 may comprise pixel data (e.g., color data) that is copied into a frame buffer or other type of surface data structure in a memory.

The data assembly 2306 stage receives the input data 2302 that specifies vertex data for high-order surfaces, primitives, or the like. The data assembly 2306 stage collects the vertex data in a temporary storage or queue, such as by receiving a command from the host processor that includes a pointer to a buffer in memory and reading the vertex data from the buffer. The vertex data is then transmitted to the vertex shading 2308 stage for processing.

The vertex shading 2308 stage processes vertex data by performing a set of operations (e.g., a vertex shader or a program) once for each of the vertices. Vertices may be, e.g., specified as a 4-coordinate vector (e.g., <x, y, z, w>) associated with one or more vertex attributes (e.g., color, texture coordinates, surface normal, etc.). The vertex shading 2308 stage may manipulate individual vertex attributes such as position, color, texture coordinates, and the like. In other words, the vertex shading 2308 stage performs operations on the vertex coordinates or other vertex attributes associated with a vertex. Such operations commonly including lighting operations (e.g., modifying color attributes for a vertex) and transformation operations (e.g., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading 2308 stage generates transformed vertex data that is transmitted to the primitive assembly 2310 stage.

The primitive assembly 2310 stage collects vertices output by the vertex shading 2308 stage and groups the vertices into geometric primitives for processing by the geometry shading 2312 stage. For example, the primitive assembly 2310 stage may be configured to group every three consecutive vertices as a geometric primitive (e.g., a triangle) for transmission to the geometry shading 2312 stage. In some embodiments, specific vertices may be reused for consecutive geometric primitives (e.g., two consecutive triangles in a triangle strip may share two vertices). The primitive assembly 2310 stage transmits geometric primitives (e.g., a collection of associated vertices) to the geometry shading 2312 stage.

The geometry shading 2312 stage processes geometric primitives by performing a set of operations (e.g., a geometry shader or program) on the geometric primitives. Tessellation operations may generate one or more geometric primitives from each geometric primitive. In other words, the geometry shading 2312 stage may subdivide each geometric primitive into a finer mesh of two or more geometric primitives for processing by the rest of the graphics processing pipeline 2300. The geometry shading 2312 stage transmits geometric primitives to the viewport SCC 2314 stage.

In an embodiment, the graphics processing pipeline 2300 may operate within a streaming multiprocessor and the vertex shading 2308 stage, the primitive assembly 2310 stage, the geometry shading 2312 stage, the fragment shading 2318 stage, and/or hardware/software associated therewith, may sequentially perform processing operations. Once the sequential processing operations are complete, in an embodiment, the viewport SCC 2314 stage may utilize the data. In an embodiment, primitive data processed by one or more of the stages in the graphics processing pipeline 2300 may be written to a cache (e.g. L1 cache, a vertex cache, etc.). In this case, in an embodiment, the viewport SCC 2314 stage may access the data in the cache. In an embodiment, the viewport SCC 2314 stage and the rasterization 2316 stage are implemented as fixed function circuitry.

The viewport SCC 2314 stage performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (e.g., discarded) because the geometric primitive will not contribute to the final rendered scene. Any geometric primitive that is partially inside the viewing frustum and partially outside the viewing frustum may be clipped (e.g., transformed into a new geometric primitive that is enclosed within the viewing frustum. Furthermore, geometric primitives may each be scaled based on a depth of the viewing frustum. All potentially visible geometric primitives are then transmitted to the rasterization 2316 stage.

The rasterization 2316 stage converts the 3D geometric primitives into 2D fragments (e.g. capable of being utilized for display, etc.). The rasterization 2316 stage may be configured to utilize the vertices of the geometric primitives to setup a set of plane equations from which various attributes can be interpolated. The rasterization 2316 stage may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization 2316 stage generates fragment data (e.g., interpolated vertex attributes associated with a particular sample location for each covered pixel) that are transmitted to the fragment shading 2318 stage.

The fragment shading 2318 stage processes fragment data by performing a set of operations (e.g., a fragment shader or a program) on each of the fragments. The fragment shading 2318 stage may generate pixel data (e.g., color values) for the fragment such as by performing lighting operations or sampling texture maps using interpolated texture coordinates for the fragment. The fragment shading 2318 stage generates pixel data that is transmitted to the raster operations 2320 stage.

The raster operations 2320 stage may perform various operations on the pixel data such as performing alpha tests, stencil tests, and blending the pixel data with other pixel data corresponding to other fragments associated with the pixel. When the raster operations 2320 stage has finished processing the pixel data (e.g., the output data 2304), the pixel data may be written to a render target such as a frame buffer, a color buffer, or the like.

It will be appreciated that one or more additional stages may be included in the graphics processing pipeline 2300 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading 2312 stage). Other types of graphics processing pipelines are contemplated as being within the scope of the present disclosure. Furthermore, any of the stages of the graphics processing pipeline 2300 may be implemented by one or more dedicated hardware units within a graphics processor such as parallel processing unit 1700. Other stages of the graphics processing pipeline 2300 may be implemented by programmable hardware units such as the SM 2000 of the parallel processing unit 1700.

The graphics processing pipeline 2300 may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the parallel processing unit 1700. The API provides an abstraction for a programmer that lets a programmer utilize specialized graphics hardware, such as the parallel processing unit 1700, to generate the graphical data without requiring the programmer to utilize the specific instruction set for the parallel processing unit 1700. The application may include an API call that is routed to the device driver for the parallel processing unit 1700. The device driver interprets the API call and performs various operations to respond to the API call. In some instances, the device driver may perform operations by executing instructions on the CPU. In other instances, the device driver may perform operations, at least in part, by launching operations on the parallel processing unit 1700 utilizing an input/output interface between the CPU and the parallel processing unit 1700. In an embodiment, the device driver is configured to implement the graphics processing pipeline 2300 utilizing the hardware of the parallel processing unit 1700.

Various programs may be executed within the parallel processing unit 1700 in order to implement the various stages of the graphics processing pipeline 2300. For example, the device driver may launch a kernel on the parallel processing unit 1700 to perform the vertex shading 2308 stage on one SM 2000 (or multiple SM 2000 modules). The device driver (or the initial kernel executed by the parallel processing unit 1700) may also launch other kernels on the parallel processing unit 1700 to perform other stages of the graphics processing pipeline 2300, such as the geometry shading 2312 stage and the fragment shading 2318 stage. In addition, some of the stages of the graphics processing pipeline 2300 may be implemented on fixed unit hardware such as a rasterizer or a data assembler implemented within the parallel processing unit 1700. It will be appreciated that results from one kernel may be processed by one or more intervening fixed function hardware units before being processed by a subsequent kernel on an SM 2000.

Machine Embodiments

Figure 24:
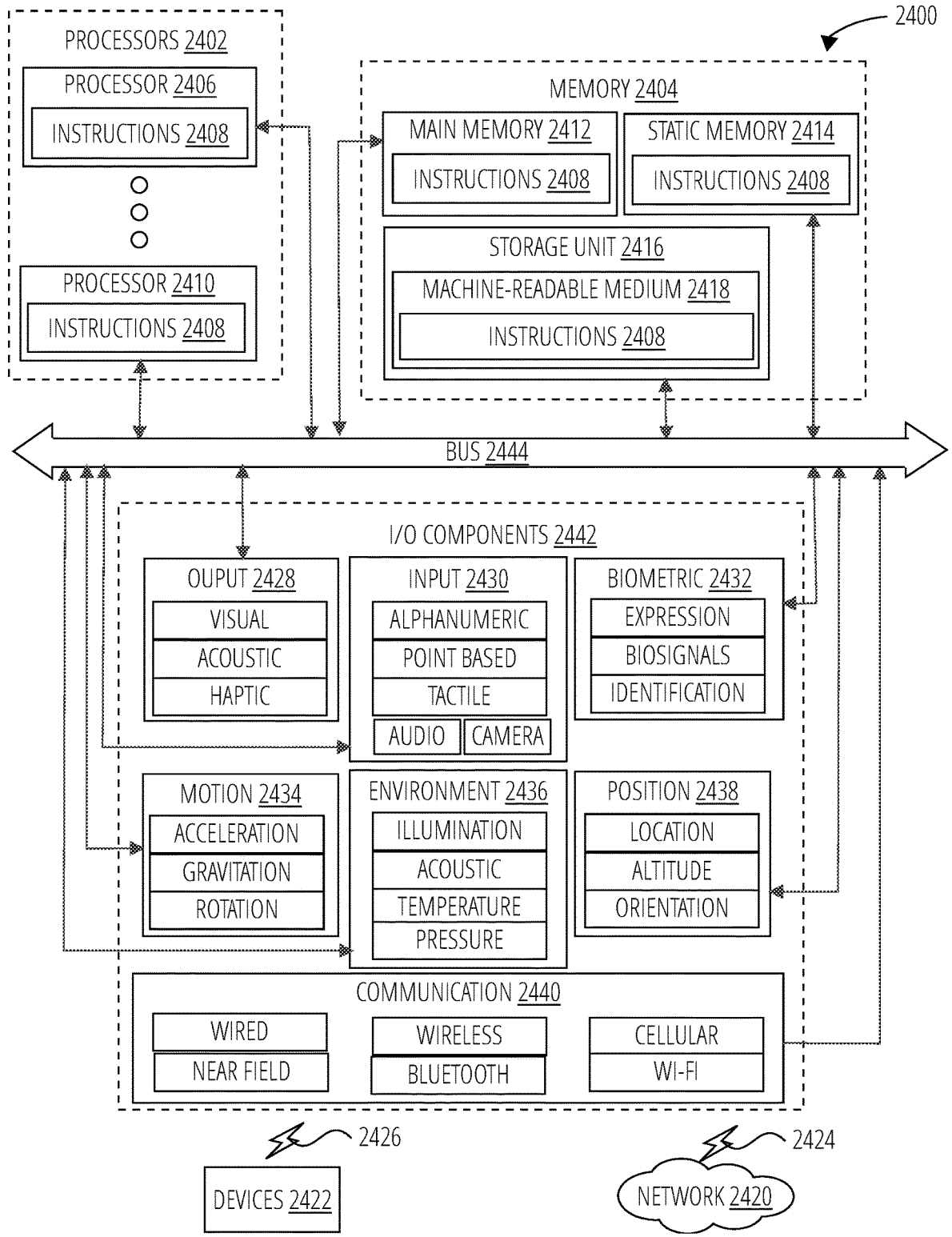
FIG. 24 illustrates a diagrammatic representation of a machine 2400 in the form of a computer system within which a set of instructions may be executed for causing the machine to perform any one or more of the methodologies discussed herein, according to an example embodiment.

FIG. 24 depicts a diagrammatic representation of a machine 2400 in the form of a computer system within which logic may be implemented to cause the machine to perform any one or more of the functions or methods disclosed herein, according to an example embodiment. The machine 2400 may for example implement the computer architectures described above and may be configured (e.g., programmed) to carry out the algorithms and techniques disclosed herein.

Specifically, FIG. 24 depicts a machine 2400 comprising instructions 2408 (e.g., a program, an application, an applet, an app, or other executable code) for causing the machine 2400 to perform any one or more of the functions or methods discussed herein. For example the instructions 2408 may cause the machine 2400 to implement embodiments of the disclosed algorithms and techniques for circuit analysis and test node insertion. The instructions 2408 configure a general, non-programmed machine into a particular machine 2400 programmed to carry out said functions and/or methods.

In alternative embodiments, the machine 2400 operates as a standalone device or may be coupled (e.g., networked) to other machines. In a networked deployment, the machine 2400 may operate in the capacity of a server machine or a client machine in a server-client network environment, or as a peer machine in a peer-to-peer (or distributed) network environment. The machine 2400 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 2408, sequentially or otherwise, that specify actions to be taken by the machine 2400. Further, while only a single machine 2400 is depicted, the term "machine" shall also be taken to include a collection of machines 200 that individually or jointly execute the instructions 2408 to perform any one or more of the methodologies or subsets thereof discussed herein.

The machine 2400 may include processors 2402, memory 2404, and I/O components 2442, which may be configured to communicate with each other such as via one or more bus 2444. In an example embodiment, the processors 2402 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) may include, for example, one or more processor (e.g., processor 2406 and processor 2410) to execute the instructions 2408. The term "processor" is intended to include multi-core processors that may comprise two or more independent processors (sometimes referred to as "cores") that may execute instructions contemporaneously. Although FIG. 24 depicts multiple processors 2402, the machine 2400 may include a single processor with a single core, a single processor with multiple cores (e.g., a multi-core processor), multiple processors with a single core, multiple processors with multiples cores, or any combination thereof.

The memory 2404 may include one or more of a main memory 2412, a static memory 2414, and a storage unit 2416, each accessible to the processors 2402 such as via the bus 2444. The main memory 2412, the static memory 2414, and storage unit 2416 may be utilized, individually or in combination, to store the instructions 2408 embodying any one or more of the functionality described herein. The instructions 2408 may reside, completely or partially, within the main memory 2412, within the static memory 2414, within a machine-readable medium 2418 within the storage unit 2416, within at least one of the processors 2402 (e.g., within the processor's cache memory), or any suitable combination thereof, during execution thereof by the machine 2400.

The I/O components 2442 may include a wide variety of components to receive input, provide output, produce output, transmit information, exchange information, capture measurements, and so on. The specific I/O components 2442 that are included in a particular machine will depend on the type of machine. For example, portable machines such as mobile phones will likely include a touch input device or other such input mechanisms, while a headless server machine will likely not include such a touch input device. It will be appreciated that the I/O components 2442 may include many other components that are not shown in FIG. 24. The I/O components 2442 are grouped according to functionality merely for simplifying the following discussion and the grouping is in no way limiting. In various example embodiments, the I/O components 2442 may include output components 2428 and input components 2430. The output components 2428 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 2430 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), one or more cameras for capturing still images and video, and the like.

In further example embodiments, the I/O components 2442 may include biometric components 2432, motion components 2434, environmental components 2436, or position components 2438, among a wide array of possibilities. For example, the biometric components 2432 may include components to detect expressions (e.g., hand expressions, facial expressions, vocal expressions, body gestures, or eye tracking), measure bio-signals (e.g., blood pressure, heart rate, body temperature, perspiration, or brain waves), identify a person (e.g., voice identification, retinal identification, facial identification, fingerprint identification, or electroencephalogram-based identification), and the like. The motion components 2434 may include acceleration sensor components (e.g., accelerometer), gravitation sensor components, rotation sensor components (e.g., gyroscope), and so forth. The environmental components 2436 may include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 2438 may include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 2442 may include communication components 2440 operable to couple the machine 2400 to a network 2420 or devices 2422 via a coupling 2424 and a coupling 2426, respectively. For example, the communication components 2440 may include a network interface component or another suitable device to interface with the network 2420. In further examples, the communication components 2440 may include wired communication components, wireless communication components, cellular communication components, Near Field Communication (NFC) components, Bluetooth® components (e.g., Bluetooth® Low Energy), WiFi® components, and other communication components to provide communication via other modalities. The devices 2422 may be another machine or any of a wide variety of peripheral devices (e.g., a peripheral device coupled via a USB).

Moreover, the communication components 2440 may detect identifiers or include components operable to detect identifiers. For example, the communication components 2440 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 2440, such as location via Internet Protocol (IP) geolocation, location via Wi-Fi® signal triangulation, location via detecting an NFC beacon signal that may indicate a particular location, and so forth.

Instruction and Data Storage Medium Embodiments

The various memories (i.e., memory 2404, main memory 2412, static memory 2414, and/or memory of the processors 2402) and/or storage unit 2416 may store one or more sets of instructions and data structures (e.g., software) embodying or utilized by any one or more of the methodologies or functions described herein. These instructions (e.g., the instructions 2408), when executed by processors 2402, cause various operations to implement the disclosed embodiments.

As used herein, the terms "machine-storage medium," "device-storage medium," "computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors and internal or external to computer systems. Specific examples of machine-storage media, computer-storage media and/or device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such intangible media, at least some of which are covered under the term "signal medium" discussed below.

Communication Network Embodiments

In various example embodiments, one or more portions of the network 2420 may be an ad hoc network, an intranet, an extranet, a VPN, a LAN, a WLAN, a WAN, a WWAN, a MAN, the Internet, a portion of the Internet, a portion of the PSTN, a plain old telephone service (POTS) network, a cellular telephone network, a wireless network, a Wi-Fi® network, another type of network, or a combination of two or more such networks. For example, the network 2420 or a portion of the network 2420 may include a wireless or cellular network, and the coupling 2424 may be a Code Division Multiple Access (CDMA) connection, a Global System for Mobile communications (GSM) connection, or another type of cellular or wireless coupling. In this example, the coupling 2424 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long range protocols, or other data transfer technology.

The instructions 2408 and/or data generated by or received and processed by the instructions 2408 may be transmitted or received over the network 2420 using a transmission medium via a network interface device (e.g., a network interface component included in the communication components 2440) and utilizing any one of a number of well-known transfer protocols (e.g., hypertext transfer protocol (HTTP)). Similarly, the instructions 2408 may be transmitted or received using a transmission medium via the coupling 2426 (e.g., a peer-to-peer coupling) to the devices 2422. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 2408 for execution by the machine 2400, and/or data generated by execution of the instructions 2408, and/or data to be operated on during execution of the instructions 2408, and includes digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a matter as to encode information in the signal.

Various logic functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

"Logic" is used herein to machine memory circuits, non transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

Having thus described illustrative embodiments in detail, it will be apparent that modifications and variations are possible without departing from the scope of the invention as claimed.

What is claimed is:

1. A method for modifying a circuit, the method comprising:
    training a plurality of graph convolutional networks to predict difficult to test nodes in the circuit;
    inserting test nodes into a representation of the circuit at the difficult to test nodes based on the predictions; and
    fabricating the circuit based on the representation of the circuit including the test nodes.

2. The method of claim 1, further comprising:
    applying test logic to the test nodes.

3. The method of claim 2, wherein the test logic is applied from a package boundary of the circuit.

4. The method of claim 1, further comprising:
    computing a testability impact for each of a plurality of the test nodes; and
    inserting each of the plurality of the test nodes only when the testability impact satisfies a threshold.

5. The method of claim 4, the testability impact computed for a local neighborhood around a node predicted to be a difficult to test node.

6. The method of claim 1, further comprising:
    the representation of the circuit comprising a netlist;
    transforming the netlist into a levelized netlist; and
    processing the levelized netlist through a series of aggregators and encoders to generate node embeddings.

7. The method of claim 6, further comprising:
    setting controllability-to-0, controllability-to-1, and observability as attributes of the node embeddings.

8. The method of claim 1, the node embedding derived from a D-hop local neighborhood of each node in the graph.

9. A system comprising:
    a plurality of graphic processing units; and
    a memory;
    the memory storing an adjacency matrix for a circuit representation, the adjacency matrix compressed to remove sparsity;
    the memory further configured with instructions to operate the plurality of graphics processing units to:
        transform the circuit representation into a plurality of graphs each representing a portion of the circuit representation;
        apply each graph to a different graph convolutional network;
        compute activations for each graph convolutional network by applying a product of an aggregation matrix and a weight matrix to an activation function of the graph convolutional network, the aggregation matrix computed from the adjacency matrix; and combine predictions of difficult to test nodes output by each graph convolutional network at a graphics processing unit dedicated to implementing a loss function for the graph convolutional networks.

10. The system of claim 9, wherein the graphics processing units are configured by the instructions into a plurality of multi-stage graph convolutional networks.

11. The system of claim 9, the circuit representation comprising a netlist.

12. The system of claim 9, each graph convolutional network comprising a plurality of aggregation and encoding layers.

13. The system of claim 9, wherein the aggregation matrix represents a D-hop local neighborhood of each node in the graph, where D>=1.

14. The system of claim 9, wherein the adjacency matrix is compressed by greater than 80 percent.

15. A system for inserting test logic to prepare a circuit for fabrication, the system comprising:
a plurality of graph convolutional neural networks;
a memory storing a circuit representation, wherein the circuit representation provides a fabrication template for the circuit;
at least one processor; and
logic to configure the at least one processor to:
provide each of the graph convolutional networks with a different graphical portion of the circuit representation to predict difficult to test nodes in the circuit representation; and
insert test nodes into the circuit representation at the difficult to test nodes based on the predictions.

16. The system of claim 15, further comprising logic to:
compute a testability impact for each of a plurality of the test nodes; and
insert any one of the plurality of the test nodes only when the testability impact satisfies a threshold.

17. The system of claim 16, wherein the testability impact is computed for a local neighborhood around a node predicted to be a difficult to test node.

18. The system of claim 15, further comprising:
the circuit representation comprising a netlist; and
logic to:
transform the netlist into a levelized netlist; and
process the levelized netlist through a series of aggregators and encoders to generate node embeddings for the graph convolutional neural networks.

19. The system of claim 18, further comprising logic to:
set controllability-to-0, controllability-to-1, and observability as attributes of the node embeddings.

20. The system of claim 18, the node embedding derived from a D-hop local neighborhood of each node in the graph.

21. A system comprising:
a plurality of graph convolutional neural networks;
a memory storing a circuit representation, the circuit representation providing a fabrication template for a circuit;
a plurality of graphics processing units;
logic to configure two or more of the graphics processing units to:
input to each of the graph convolutional networks a different graphical portion of the circuit representation to predict difficult to test nodes in the circuit representation; and
insert test nodes into the circuit representation at the difficult to test nodes based on the predictions; and
the plurality of graphics processing units arranged such that the combined predictions of difficult to test nodes output by each graph convolutional network are input to one of the plurality of graphics processing units dedicated to implementing a loss function for the graph convolutional networks.

22. The system of claim 21, further comprising logic to:
compute a testability impact for each of a plurality of the test nodes; and
insert any one of the plurality of the test nodes only when the testability impact satisfies a threshold.

23. The system of claim 22, wherein the testability impact is computed for a local neighborhood around a node predicted to be a difficult to test node.

24. The system of claim 21, further comprising:
the circuit representation comprising a netlist; and
logic to:
transform the netlist into a levelized netlist; and
process the levelized netlist through a series of aggregators and encoders to generate node embeddings for the graph convolutional neural networks.

25. The system of claim 24, further comprising logic to:
set controllability-to-0, controllability-to-1, and observability as attributes of the node embeddings.

26. The system of claim 24, the node embedding derived from a D-hop local neighborhood of each node in the graph.

* * * * *